(12) United States Patent
Li et al.

(10) Patent No.: US 11,774,484 B1
(45) Date of Patent: Oct. 3, 2023

(54) WIRE VOLTAGE MEASUREMENT METHOD AND APPARATUS BASED ON ELECTRIC FIELD SENSOR

(71) Applicant: Digital Grid Research Institute, China S. Pwr Grid, Guangzhou (CN)

(72) Inventors: Peng Li, Guangzhou (CN); Bing Tian, Guangzhou (CN); Qiancheng Lv, Guangzhou (CN); Zhenheng Xu, Guangzhou (CN); Xu Yin, Guangzhou (CN); Renze Chen, Guangzhou (CN); Shaoxiong Nie, Guangzhou (CN); Zejie Tan, Guangzhou (CN); Zhiming Wang, Guangzhou (CN); Licheng Li, Guangzhou (CN)

(73) Assignee: Digital Grid Research Inst., China South Pwr Grid, Guangzhou (CN)

( * ) Notice: Subject to any disclaimer, the term of this patent is extended or adjusted under 35 U.S.C. 154(b) by 0 days.

(21) Appl. No.: 17/856,346

(22) Filed: Jul. 1, 2022

(30) Foreign Application Priority Data

Apr. 6, 2022 (CN) .......................... 202210356962.5

(51) Int. Cl.
*G01R 29/12* (2006.01)
*G01R 19/00* (2006.01)

(52) U.S. Cl.
CPC ......... *G01R 29/12* (2013.01); *G01R 19/0084* (2013.01); *G01R 19/0092* (2013.01)

(58) Field of Classification Search
CPC ........ G01R 29/00; G01R 29/12; G01R 19/00; G01R 19/0084; G01R 19/0092
See application file for complete search history.

(56) References Cited

U.S. PATENT DOCUMENTS 10,613,123 B2 * 4/2020 Gudmundsson ... G01R 29/0814

FOREIGN PATENT DOCUMENTS

| CN | 107064615 A | 8/2017 |
|---|---|---|
| CN | 109030932 A | 12/2018 |

(Continued)

OTHER PUBLICATIONS

Chinese Office Action for corresponding Application No. 202210356962.5 dated May 20, 2022, 12 pages.

(Continued)

*Primary Examiner* — Hoai-An D. Nguyen
(74) *Attorney, Agent, or Firm* — Seyfarth Shaw LLP

(57) ABSTRACT

A wire voltage measurement method includes: acquiring a first corresponding relationship of an electric field intensity of a to-be-measured wire, a voltage of the to-be-measured wire, and a perpendicular distance between an electric field sensor and the to-be-measured wire; measuring at least four initial electric field intensities in an electric field sensitive direction through the at least four electric field sensors, and acquiring distances among the four electric field sensors along the straight line; calculating a second corresponding relationship of the voltage of the to-be-measured wire and an external interference electric field intensity in the electric field sensitive direction according to the four initial electric field intensities, the distances among the four electric field sensors along the straight line, the first corresponding relationship, and a spatial position relationship of the at least four electric field sensors; calculating the voltage of the to-be-measured wire according to the second corresponding relationship.

13 Claims, 9 Drawing Sheets

(56) References Cited

FOREIGN PATENT DOCUMENTS

| CN | 109283379 | A |   | 1/2019  |            |
|----|-----------|---|---|---------|------------|
| CN | 109283380 | A |   | 1/2019  |            |
| CN | 109933090 | A | * | 6/2019  | G05D 1/10  |
| CN | 110174548 | A |   | 8/2019  |            |
| CN | 111426870 | A |   | 7/2020  |            |
| CN | 111650446 | A |   | 9/2020  |            |
| CN | 111650539 | A |   | 9/2020  |            |
| WO | 2016177571| A2|   | 11/2016 |            |

OTHER PUBLICATIONS

First Search document for corresponding Application No. 2022103569625 dated Apr. 6, 2022, 2 pages.

* cited by examiner

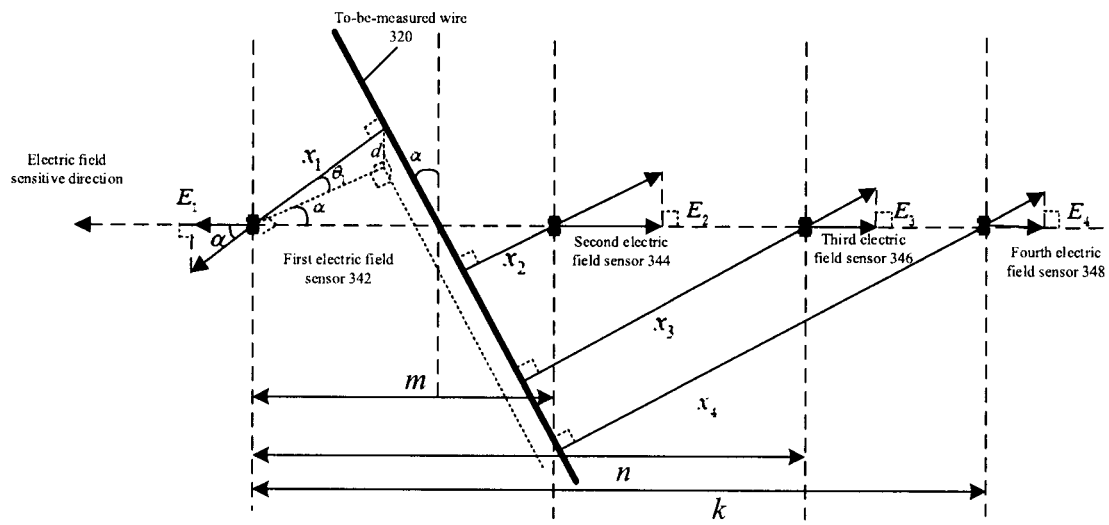

FIG. 3

S262 a second corresponding relationship between the voltage of the to-be-measured wire and the external interference electric field intensity in the electric field sensitive direction is calculated according to the at least four initial electric field intensities, the distances among the at least four electric field sensors along the straight line, the first corresponding relationship, and the spatial position relationship of the at least four electric field sensors

S264 the voltage of the to-be-measured wire is calculated according to the second corresponding relationship

FIG. 4

```
                                                                    S802
┌─────────────────────────────────────────────────────────────────────────┐
│ the third expression of the first perpendicular distance and the first included angle is │
│   calculated according to the first initial electric field intensity, the second initial │
│      electric field intensity, the third initial electric field intensity, the external │
│   interference electric field intensity in the electric field sensitive direction, the first │
│   corresponding relationship, and the spatial position relationship of the first electric │
│     field sensor, the second electric field sensor, and the third electric field sensor │
└─────────────────────────────────────────────────────────────────────────┘
                                    │
                                    ▼                                S804
┌─────────────────────────────────────────────────────────────────────────┐
│ a fourth expression of the first perpendicular distance and the first included angle is │
│   calculated according to the first initial electric field intensity, the second initial │
│     electric field intensity, the fourth initial electric field intensity, the external │
│   interference electric field intensity in the electric field sensitive direction, the first │
│   corresponding relationship, and the spatial position relationship of the first electric │
│      field sensor, the second electric field sensor and the fourth electric field sensor │
└─────────────────────────────────────────────────────────────────────────┘
                                    │
                                    ▼                                S806
┌─────────────────────────────────────────────────────────────────────────┐
│ the first perpendicular distance between the first electric field sensor and the to-be- │
│ measured wire, and the first included angle between the first electric field sensor and │
│    the to-be-measured wire are calculated according to the third expression and the │
│                                 fourth expression │
└─────────────────────────────────────────────────────────────────────────┘
```

FIG. 10

ND APPARATUS BASED ON ELECTRIC
FIELD SENSOR

CROSS REFERENCE TO RELATED APPLICATION

The present disclosure is based on and claims priority to Chinese Patent Application with No. 202210356962.5 and filed on Apr. 6, 2022, the content of which is expressly incorporated herein by reference in its entirety.

TECHNICAL FIELD

The present disclosure relates to the technical field of electric power measurement, and particularly to a wire voltage measurement method and apparatus based on an electric field sensor.

BACKGROUND

With the continuous development of the power system, the structure of the power grid becomes more and more complex. The measurement and real-time detection of the voltage in the power system is the key to ensure the normal operation of the power system.

In the traditional method, the voltage is usually measured by a voltage transformer; but the voltage transformer is large in size, heavy in weight, and complicated in installation. In recent years, with the emergence of related materials for electric field sensor chips and the advancement of process technology, electric field sensors that can be used for electric field measurement in power systems have appeared. However, if a single electric field sensor is utilized to measure the voltage, it is necessary to fix the positional relationship between the electric field sensor chip and the wire first, and obtain the proportional relationship between the voltage and the electric field in advance, and then use the positional relationship, the measured electric field intensity and the proportional relationship to calculate the voltage value of the wire.

However, when the voltage is measured with a single electric field sensor, once the positional relationship changes, the proportional relationship between the voltage and the electric field also changes. While, each time a single electric field sensor is used for the voltage measurement, the positional relationship between the electric field sensor chip and the wire cannot be guaranteed to remain unchanged. Therefore, the proportional relationship between the voltage and the electric field needs to be determined for each measurement to accurately calculate the voltage of the wire. In other words, the voltage measurement method in the conventional method is more complicated.

SUMMARY

In view of this, as for the above-mentioned problem, it is necessary to provide a wire voltage measurement method and apparatus based on electric field sensors.

In the first aspect of the present disclosure, a wire voltage measurement method based on electric field sensors is provided, which is applied to a voltage sensor including at least four electric field sensors, and the at least four electric field sensors are arranged along the same straight line, the method includes:

acquiring a first corresponding relationship of an electric field intensity of a to-be-measured wire, a voltage of the to-be-measured wire, and a perpendicular distance between an electric field sensor and the to-be-measured wire;

measuring at least four initial electric field intensities in an electric field sensitive direction through the at least four electric field sensors, and acquiring distances among the at least four electric field sensors along the straight line;

calculating a second corresponding relationship of the voltage of the to-be-measured wire and an external interference electric field intensity in the electric field sensitive direction according to the at least four initial electric field intensities, the distances among the at least four electric field sensors along the straight line, the first corresponding relationship, and a spatial position relationship of the at least four electric field sensors;

calculating the voltage of the to-be-measured wire according to the second corresponding relationship.

In an embodiment, the at least four electric field sensors includes a first electric field sensor, a second electric field sensor, a third electric field sensor, and a fourth electric field sensor; the first electric field sensor is configured to measure a first initial electric field intensity, the second electric field sensor is configured to measure a second initial electric field intensity, the third electric field sensor is configured to measure a third initial electric field intensity, and the fourth electric field sensor is configured to measure a fourth initial electric field intensity.

In an embodiment, the calculating the second corresponding relationship of the voltage of the to-be-measured wire and the external interference electric field intensity in the electric field sensitive direction according to the at least four initial electric field intensities, the distances among the at least four electric field sensors along the straight line, the first corresponding relationship, and the spatial position relationship of the at least four electric field sensors includes:

calculating a first expression related to the voltage of the to-be-measured wire and the interference electric field intensity in the electric field sensitive direction according to the first initial electric field intensity, the second initial electric field intensity, the third initial electric field intensity, the external interference electric field intensity in the electric field sensitive direction, the first corresponding relationship and a spatial position relationship of the first electric field sensor, the second electric field sensor, and the third electric field sensor;

calculating a second expression related to the voltage of the to-be-measured wire and the interference electric field intensity in the electric field sensitive direction according to the first initial electric field intensity, the second initial electric field intensity, the fourth initial electric field intensity, the external interference electric field intensity in the electric field sensitive direction, the first corresponding relationship, and a spatial position relationship of the first electric field sensor, the second electric field sensor, and the fourth electric field sensor.

In an embodiment, the calculating the voltage of the to-be-measured wire according to the second corresponding relationship includes:

determining a value range of the interference electric field intensity in the electric field sensitive direction according to the at least four initial electric field intensities;

determining an initial interference electric field intensity from the value range according to a preset stride length, inputting the initial interference electric field intensity into the first expression and the second expression, and calculating candidate voltages of the to-be-measured wire;

determining whether the candidate voltages of the to-be-measured wire satisfy a preset condition, wherein the preset condition includes that a difference value between the candidate voltages of the to-be-measured wire is less than a preset difference value threshold;

taking a candidate voltage of the to-be-measured wire satisfying the preset condition as the voltage of the to-be-measured wire.

In an embodiment, the method further includes:

determining a new interference electric field intensity according to the initial interference electric field intensity and the preset stride length when the candidate voltages of the to-be-measured wire dissatisfy the preset condition;

performing an iterative operation with the new interference electric field intensity as the initial interference electric field intensity, and generating the candidate voltages of the to-be-measured wire until the candidate voltages of the to-be-measured wire satisfy the preset condition, and take one of the candidate voltages of the to-be-measured wire satisfying the preset condition as the voltage of the to-be-measured wire.

In an embodiment, the at least four electric field sensors are arranged on a plane perpendicular to the to-be-measured wire, and calculating the voltage of the to-be-measured wire according to the at least four initial electric field intensities, the distances among the at least four electric field sensors along the straight line, and the first corresponding relationship includes:

calculating a first perpendicular distance between the first electric field sensor and the to-be-measured wire and a first included angle between the first electric field sensor and the to-be-measured wire according to the at least four initial electric field intensities, the external interference electric field intensity in the electric field sensitive direction, the first corresponding relationship, and the spatial position relationship of the at least four electric field sensors;

calculating a third corresponding relationship according to the at least four initial electric field intensities, the external interference electric field intensity in the electric field sensitive direction, the first corresponding relationship, and the spatial position relationship of the at least four electric field sensors, wherein the third corresponding relationship is a corresponding relationship of a difference value between the first initial electric field intensity and the second initial electric field intensity, the voltage of the to-be-measured wire, a distance between the first electric field sensor and the second electric field sensor, the first perpendicular distance between the first electric field sensor and the to-be-measured wire, and the first included angle between the first electric field sensor and the to-be-measured wire;

calculating the voltage of the to-be-measured wire according to the first perpendicular distance between the first electric field sensor and the to-be-measured wire, the first included angle between the first electric field sensor and the to-be-measured wire, and the third corresponding relationship.

In an embodiment, the calculating the first perpendicular distance between the first electric field sensor and the to-be-measured wire and the first included angle between the first electric field sensor and the to-be-measured wire according to the at least four initial electric field intensities, the external interference electric field intensity in the electric field sensitive direction, the first corresponding relationship, and the spatial position relationship of the at least four electric field sensors includes:

calculating a third expression related to the first perpendicular distance and the first included angle according to the first initial electric field intensity, the second initial electric field intensity, the third initial electric field intensity, the external interference electric field intensity in the electric field sensitive direction, the first corresponding relationship, and the spatial position relationship of the first electric field sensor, the second electric field sensor, and the third electric field sensor;

calculating a fourth expression related to the first perpendicular distance and the first included angle according to the first initial electric field intensity, the second initial electric field intensity, the fourth initial electric field intensity, the external interference electric field intensity in the electric field sensitive direction, the first corresponding relationship, and the spatial position relationship of the first electric field sensor, the second electric field sensor, and the fourth electric field sensor;

calculating the first perpendicular distance between the first electric field sensor and the to-be-measured wire and the first included angle between the first electric field sensor and the to-be-measured wire according to the third expression and the fourth expression.

In an embodiment, the calculating the first perpendicular distance between the first electric field sensor and the to-be-measured wire and the first included angle between the first electric field sensor and the to-be-measured wire according to the third expression and the fourth expression includes:

calculating a first initial perpendicular distance between the first electric field sensor and the to-be-measured wire, and a first initial included angle between the first electric field sensor and the to-be-measured wire according to the third expression and the fourth expression;

determining whether the first initial perpendicular distance and the first initial included angle satisfy the preset condition, wherein the preset condition includes that the first initial perpendicular distance is a positive value, and the first initial included angle is greater than a preset included angle threshold;

taking the first initial perpendicular distance and the first initial included angle that satisfy the preset condition respectively as the first perpendicular distance between the first electric field sensor and the to-be-measured wire, and the first included angle between the first electric field sensor and the to-be-measured wire.

In an embodiment, the calculating the third corresponding relationship according to the at least four initial electric field intensities, the external interference electric field intensity in the electric field sensitive direction, the first corresponding relationship, and the spatial position relationship of the at least four electric field sensors includes:

calculating an electric field intensity component of an electric field intensity of the to-be-measured wire mapped in the electric field sensitive direction;

establishing a fourth corresponding relationship of the electric field intensity component, the external interference electric field intensity in the electric field sensitive direction, and the at least four initial electric field intensities;

calculating the third corresponding relationship according to the fourth corresponding relationship and the spatial position relationship of the at least four electric field sensors.

In the second aspect of the present disclosure, a wire voltage measurement apparatus based on electric field sensors is provided, which is applied to a voltage sensor including at least four electric field sensors, and the at least four electric field sensors are arranged along the same straight line, the apparatus includes:

a first acquisition module, configured to acquire a first corresponding relationship of an electric field intensity of a to-be-measured wire, a voltage of the to-be-measured wire, and a perpendicular distance between the electric field sensors and the to-be-measured wire;

a second acquisition module, configured to measure at least four initial electric field intensities in an electric field sensitive direction through the at least four electric field sensors, and acquire distances among the at least four electric field sensors along the straight line;

a voltage calculation module, configured to: calculate a second corresponding relationship of the voltage of the to-be-measured wire and an external interference electric field intensity in the electric field sensitive direction according to the at least four initial electric field intensities, the distances among the at least four electric field sensors along the straight line, the first corresponding relationship, and a spatial position relationship of the at least four electric field sensors; and calculate the voltage of the to-be-measured wire according to the second corresponding relationship.

In the third aspect of the present disclosure, a voltage sensor is provided, including a processor and a memory storing a computer program, the processor, when executing the computer program, performs the steps of:

acquiring a first corresponding relationship of an electric field intensity of a to-be-measured wire, a voltage of the to-be-measured wire, and a perpendicular distance between the electric field sensors and the to-be-measured wire;

measuring at least four initial electric field intensities in an electric field sensitive direction through the at least four electric field sensors, and acquiring distances among the at least four electric field sensors along the straight line;

calculating the voltage of the to-be-measured wire according to the at least four initial electric field intensities, the distances among the at least four electric field sensors along the straight line, and the first corresponding relationship.

In the fourth aspect of the present disclosure, a computer-readable storage medium is provided, on which a computer program is stored, a processor, when executing the computer program, performs the steps of:

acquiring a first corresponding relationship of an electric field intensity of a to-be-measured wire, a voltage of the to-be-measured wire, and a perpendicular distance between the electric field sensors and the to-be-measured wire;

measuring at least four initial electric field intensities in an electric field sensitive direction through the at least four electric field sensors, and acquiring distances among the at least four electric field sensors along the straight line;

calculating the voltage of the to-be-measured wire according to the at least four initial electric field intensities, the distances among the at least four electric field sensors along the straight line, and the first corresponding relationship.

In the fifth aspect of the present disclosure, a computer program product is provided, including a computer program, a processor, when executing the computer program, performs the steps of:

acquiring a first corresponding relationship of an electric field intensity of a to-be-measured wire, a voltage of the to-be-measured wire, and a perpendicular distance between the electric field sensors and the to-be-measured wire;

measuring at least four initial electric field intensities in an electric field sensitive direction through the at least four electric field sensors, and acquiring distances among the at least four electric field sensors along the straight line;

calculating the voltage of the to-be-measured wire according to the at least four initial electric field intensities, the distances among the at least four electric field sensors along the straight line, and the first corresponding relationship.

The above-mentioned wire voltage measurement method and apparatus based on electric field sensors are applied to the voltage sensor including at least four electric field sensors, and the at least four electric field sensors are arranged along the same straight line; the first corresponding relationship of an electric field intensity of a to-be-measured wire, a voltage of the to-be-measured wire, and a perpendicular distance between an electric field sensor and the to-be-measured wire is acquired; the at least four initial electric field intensities in an electric field sensitive direction are measured through the at least four electric field sensors, and the distances among the at least four electric field sensors along the straight line are acquired; the voltage of the to-be-measured wire is calculated according to the at least four initial electric field intensities, the distances among the at least four electric field sensors along the straight line, and the first corresponding relationship. In the above-mentioned wire voltage measurement method, only the initial electric field intensities of the at least four electric field sensors, the distances among the electric field sensors and the first corresponding relationship are required, and then the voltage of the to-be-measured wire can be calculated, that is, the voltage of the to-be-measured wire is calculated and obtained without considering the position relationship between the wire and the electric field sensors, accordingly the measurement method is simpler. It follows that the position relationship between the to-be-measured wire and the electric field sensors does not affect the calculation of the voltage value of the to-be-measured wire, so that the electric field sensors can be arranged arbitrarily with respect to the to-be-measured wire, accordingly the difficulty in installation of the electric field sensors is greatly reduced. Further, since the difficulty in the installation of the electric field sensors is reduced, it is easier to obtain the voltage value of the to-be-measured wire when the voltage of the wire is measured by the voltage sensor according to the above-mentioned wire voltage measurement method.

BRIEF DESCRIPTION OF THE DRAWINGS

FIG. 3 is a schematic diagram of a wire voltage measurement method according to an embodiment.

FIG. 4 is a flow chart showing a method for calculating a voltage of a to-be-measured wire according to at least four initial electric field intensities, distances a between the at least four electric field sensors long a straight line, and a first corresponding relationship in FIG. 2.

FIG. 10 is a flow chart showing a method for calculating a first perpendicular distance between a first electric field sensor and the to-be-measured wire and a first angle between the first electric field sensor and the to-be-measured wire, according to the at least four initial electric field intensities, the external interference electric field intensity in the electric field sensitive direction, the first corresponding relationship and the spatial position relationship between the at least four electric field sensors.

DETAILED DESCRIPTION

Figure 1:
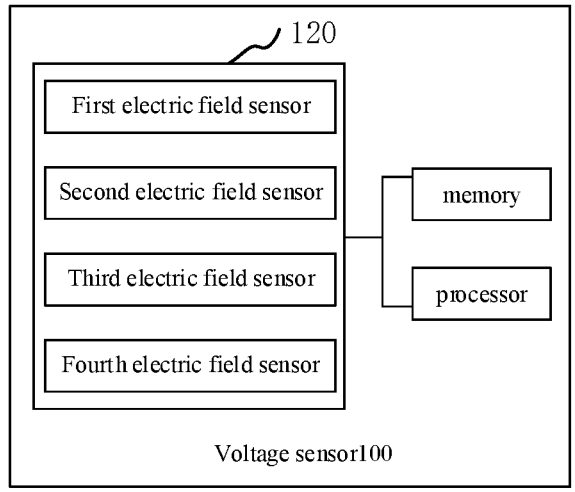
FIG. 1 is an application environment diagram of a wire voltage measurement method according to an embodiment.

In order to make the purpose, the technical solution and advantages of the present disclosure clearer, the present disclosure will be further detailed with reference to the accompanying drawings and embodiments. It should be appreciated that specific embodiments described here are merely used for explanation of the present disclosure, rather than limiting the present disclosure.

In the description of the present disclosure, it should be noted that the terms such as "upper", "lower", "left", "right", "perpendicular", "horizontal", "inner", "outer", etc., indicate the orientation or position relationship are based on the orientation or position relationship shown in the accompanying drawings, which is only for the convenience of describing the present disclosure and simplifying the description, rather than indicating or implying that the referred device or element definitely has a specific orientation, or is constructed and operated in a specific orientation. Therefore, they should not be construed as a limitation to the present disclosure. Furthermore, the terms "first", "second", "third", "fourth" are merely used for description and should not be construed to indicate or imply a relative importance.

A voltage is an important operating state data in the power system, which is crucial to the operation and protection of the power system. Therefore, how to obtain voltage data accurately and conveniently has always been an important research topic in the power system.

A voltage transformer is usually utilized to measure the voltage of the wire. When the voltage is measured, the voltage transformer needs to be electrically connected to a circuit under measurement containing the wire, so that the wire voltage can be measured. Therefore, the circuit under measurement needs to be powered off first, and then the voltage transformer is electrically connected to the circuit under measurement when the circuit is powered off. Accordingly, when the voltage transformer is utilized to measure the voltage of the wire in the conventional method, the measurement method is complicated.

In recent years, with the emergence of related materials for electric field sensor chips and the advancement of the process technology, electric field sensors that can be used for electric field measurement in the power system have emerged. In the conventional method, a single electric field sensor can be utilized to measure the electric field intensity, and then the voltage of the wire can be calculated based on the electric field intensity. However, if a single electric field sensor is utilized to measure the voltage, it is necessary to fix the position relationship between the electric field sensor chip and the wire first, and obtain the proportional relationship between the voltage and the electric field in advance, and then utilize the position relationship, the measured electric field intensity and the proportional relationship to calculate the voltage value of the wire.

However, when the voltage is measured with a single electric field sensor, once the position relationship changes, the proportional relationship between the voltage and the electric field also changes. However, each time a single electric field sensor is used for the voltage measurement, the position relationship between the electric field sensor chip and the wire cannot be guaranteed to remain unchanged. Therefore, the proportional relationship between the voltage and the electric field needs to be determined for each measurement to accurately calculate the voltage of the wire. In other words, the voltage measurement method in the conventional method is complicated.

In order to solve the problem that the measurement method is complicated when measuring the wire voltage, a new wire voltage measurement method based on an electric field sensor is provided. The wire voltage measurement method provided in the embodiment of the present disclosure is applied to a voltage sensor 100 shown in FIG. 1. The voltage sensor includes at least four electric field sensors 120, and each electric field sensor includes an electric field sensor chip and other elements. The above-mentioned at least four electric field sensors are arranged along the same straight line, and the plurality of electric field sensors are configured to obtain electric field intensities at locations thereof. The voltage sensor consisting of the at least four electric field sensors does not need to be electrically connected to a to-be-measured wire, so that the voltage sensor can be arranged on the wire or is positioned at a certain distance from the to-be-measured wire, to calculate the voltage of the to-be-measured wire. The voltage sensor 100 is configured to acquire a first corresponding relationship of the electric field intensity of the to-be-measured wire, the voltage of the to-be-measured wire, and a perpendicular distance between the electric field sensors and the to-be-measured wire; at least four initial electric field intensities along an electric field sensitive direction are measured through the at least four electric field sensors; distances among the at least four electric field sensors along the straight line are acquired; the voltage of the to-be-measured wire is calculated.

Figure 2:
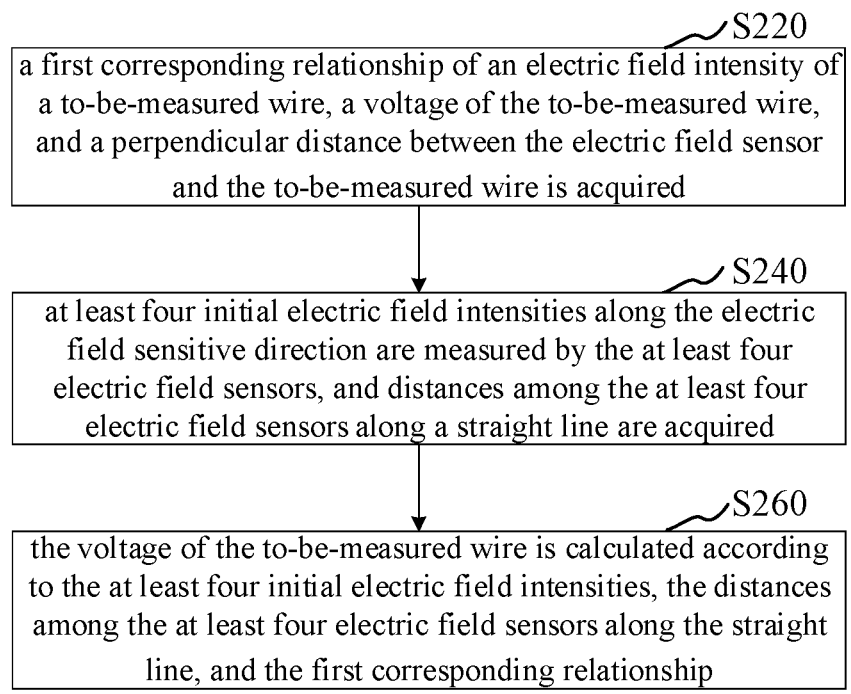
FIG. 2 is a flow chart showing a wire voltage measurement method according to an embodiment.

In an embodiment, as shown in FIG. 2, a wire voltage measurement method is provided. The method is applied to the voltage sensor 100 in FIG. 1 as an example. The voltage sensor includes at least four electric field sensors 120; the at least four electric field sensors are arranged along the same straight line; a plurality of electric field sensors are configured to obtain electric field intensities at locations thereof. The method includes the following steps.

S220: a first corresponding relationship of an electric field intensity of a to-be-measured wire, a voltage of the to-be-measured wire, and a perpendicular distance between the electric field sensors and the to-be-measured wire is acquired.

The electric field intensity of the to-be-measured wire is an electric field intensity generated by the to-be-measured wire in a space; and a direction of the electric field intensity is a direction of a connection line between the to-be-measured wire and the electric field sensor. Since the wire to be tested may have a cylindrical structure, the distance between the electric field sensor and the to-be-measured wire is the shortest straight-line distance, that is, the perpendicular distance.

Specifically, the voltage sensor 100 acquires the first corresponding relationship of the electric field intensity of the to-be-measured wire, the voltage of the to-be-measured wire, and the perpendicular distance between the electric field sensor and the to-be-measured wire. The voltage sensor calculates the first corresponding relationship in advance, and pre-stores the first corresponding relationship in a memory. If the voltage of the wire needs to be measured by the voltage sensor, the first corresponding relationship can be obtained from the memory first.

The calculation process of the first corresponding relationship of the electric field intensity of the to-be-measured wire, the voltage of the to-be-measured wire, and the perpendicular distance between the electric field sensor and the to-be-measured wire includes the following steps.

At the first step, assuming that the long straight wire is uniformly charged, and the charge per unit length is $\lambda$, $\varepsilon_0$ is a vacuum permittivity, according to the Gauss theorem, the electric field intensity positioned at a distance x from the straight line is:

$$E = \frac{\lambda}{2\pi\varepsilon_0 x}. \quad (1-1)$$

At the second step, a point outside the wire is selected as a potential reference point. Assuming that a distance between the potential reference point and the wire is $x_0$, and a radius of the wire is R, then an integral operation is performed from the potential reference point to a surface of the wire, the voltage of the wire can be obtained as follows:

$$V_x = \frac{\lambda}{2\pi\varepsilon_0} \ln \frac{x_0}{R}. \quad (1-2)$$

At the third step, through the combination of the formula (1-1) and formula (1-2), the first corresponding relationship of the electric field intensity of the to-be-measured wire, the voltage of the to-be-measured wire, and the perpendicular distance between the electric field sensor and the to-be-measured wire can be obtained as follows:

$$E = \frac{V_x}{x \ln \frac{x_0}{R}}. \quad (1-3)$$

It can be seen from the formula (1-3) that after the potential reference point is selected, the electric field intensity generated by the charged wire in the space is proportional to the voltage of the wire and inversely proportional to the distance.

In the actual calculation process, the potential reference point can be located at any position outside the wire. For example, the potential reference point can be arranged at a ground position perpendicular to the wire. At this time, $x_0$ is an installation height of the voltage sensor. The radius R of the wire is also a known quantity; and the radius of the wire can be obtained according to model information of the wire, or can be obtained by measurement or the like. Since both $x_0$ and R are known quantities, $x_0$ and R can be pre-stored in the memory for use in subsequent calculations; or $$\ln \frac{x_0}{R}$$

can be calculated directly and substituted into the first corresponding relationship and then stored in the memory. Accordingly, when the voltage of the wire is measured by the voltage sensor, the first corresponding relationship including the known parameters can be directly obtained from the memory.

S240: at least four initial electric field intensities along the electric field sensitive direction are measured by the at least four electric field sensors, and distances among the at least four electric field sensors along a straight line are acquired.

FIG. 3 is a schematic diagram showing a wire voltage measurement method in an embodiment. In FIG. 3, a to-be-measured wire 320 is included; and at least four electric field sensors include a first electric field sensor 342, a second electric field sensor 344, a third electric field sensor 346, and a fourth electric field sensor 348. The first electric field sensor 342, the second electric field sensor 344, the third electric field sensor 346 and the fourth electric field sensor 348 are arranged along the same straight line; and the above-mentioned at least four electric field sensors can be arbitrarily arranged relative to the to-be-measured wire. For example, as shown in FIG. 3, four electric field sensors are arranged crosswise with respect to the to-be-measured wire.

The electric field sensitive direction is a direction of the electric field intensity which can be measured by the electric field sensor, in other words, the electric field sensitive direction can be specified when the voltage sensor is assembled, so that the electric field sensitive directions of different voltage sensors may be different. As shown in FIG. 3, the electric field sensitivity direction is horizontal to the left. In other voltage sensors, the electric field sensitivity direction may also be other directions, such as a perpendicular downward direction. The initial electric field intensity obtained by the electric field sensor is an electric field intensity actually measured in the electric field sensitive direction. For example, the first initial electric field intensity E is measured by the first electric field sensor; the second initial electric field intensity $E_2$ is measured by the second electric field sensor; the third initial electric field intensity $E_3$ is measured by the third electric field sensor; and the fourth initial electric field intensity $E_4$ is measured by the fourth electric field sensor.

Specifically, the positions of the at least four electric field sensors can be fixed when the voltage sensor is pre-assembled, and meanwhile the distances among the electric field sensors can be measured at the same time, and the measured distances can be stored in the memory of the voltage sensor. When the calculation is performed, the voltage sensor 100 acquires the stored distances among the electric field sensors; alternatively, it is also possible not to fix the positions of the at least four electric field sensors in the voltage sensor in advance, but to accordingly adjust the positions of the electric field sensors according to actual situations when the voltage is measured. Here, the distance between the electric field sensors can be measured by a distance sensor. In addition, the distances among the at least four electric field sensors along the straight line includes a distance between adjacent electric field sensors, or a distance between one of the electric field sensors and another of the electric field sensors. For example, the distances may include a distance between the first electric field sensor 342 and the second electric field sensor 344, a distance between the second electric field sensor 344 and the third electric field sensor 346, a distance between the third electric field sensor 346 and the fourth electric field sensor 348; alternatively, the distances may include a distance m between the first electric field sensor 342 and the second electric field sensor 344, a distance n between the first electric field sensor 342 and the third electric field sensor 346, and a distance k between the first electric field sensor 342 and the fourth electric field sensor 348. Of course, the present disclosure does not limit this.

S260: the voltage of the to-be-measured wire is calculated according to the at least four initial electric field intensities, the distances among the at least four electric field sensors along the straight line, and the first corresponding relationship.

Specifically, the at least four electric field sensors in the voltage sensor 100 can measure at least four initial electric field intensities; and the distances among the at least four electric field sensors along the same straight line are pre-stored in the memory, or measured by the distance sensor; the voltage sensor 100 can acquire the first corresponding relationship of the electric field intensity of the to-be-measured wire, the voltage of the to-be-measured wire, and the perpendicular distance between the electric field sensor and the to-be-measured wire; and then a processor in the voltage sensor 100 uses the above at least four initial electric field intensities, the distances among the at least four electric field sensors, and the first corresponding relationship to calculate and obtain the voltage of the to-be-measured wire. The calculation method of the voltage of the to-be-measured wire can include a step of directly inputting the at least four initial electric field intensities, the distances among the at least four electric field sensors, and the first corresponding relationship into calculation formulas stored in the memory to perform the calculation, and directly obtain the to-be-measured wire. Alternatively, the voltage of the to-be-measured wire can be finally obtained through a derivation step by step with the at least four initial electric field intensities, the distances among the at least four electric field sensors, and the first corresponding relationship.

In the above voltage measurement method, it is only necessary to acquire the initial electric field intensities of at least four electric field sensors, and the distances among the electric field sensors and the first corresponding relationship, and then the voltage of the to-be-measured wire can be calculated, that is to say, when the voltage of the to-be-measured wire is calculated, there is no need to consider the distance between the wire and the electric field sensor and an arrangement angle of the electric field sensor, etc. The electric field sensors can be arranged arbitrarily relative to the to-be-measured wire, as long as the four electric field sensors are arranged along the same straight line and perpendicular to the wire. Such arrangement greatly reduces the installation difficulty of the electric field sensors. Further, since the installation difficulty of the voltage sensor used for measuring the voltage of the wire is reduced, and meanwhile the initial electric field intensity can be obtained by the electric field sensor, and the distances among multiple electric field sensors are also easier to obtain, accordingly it is also easier to obtain the voltage value of the to-be-measured wire by using the above-mentioned voltage measurement method.

In the above embodiments, the voltage sensor including at least four electric field sensors is provided, and the electric field sensors will be introduced below. In an embodiment, the at least four electric field sensors include a first electric field sensor, a second electric field sensor, a third electric field sensor, and a fourth electric field sensor. The first electric field sensor is configured to measure a first initial electric field intensity; and the second electric field sensor is configured to measure a second initial electric field intensity; the third electric field sensor is configured to measure a third initial electric field intensity; and the fourth electric field sensor is configured to measure a fourth initial electric field intensity.

Specifically, at least four electric field sensors are arranged along the same straight line, and at least four electric field sensors are configured to measure the electric field intensities in the electric field sensitive direction. For example, in FIG. 2, the electric field sensitive direction is horizontally to the left, then what the first electric field sensor measures is a first initial electric field intensity $E_1$ in the electric field sensitive direction which is horizontal to the left; what the second electric field sensor measures is a second initial electric field intensity $E_2$ in the electric field sensitive direction which is horizontal to the left; what the third electric field sensor measures is a third initial electric field intensity $E_3$ in the field sensitive direction which is horizontal to the left; and what the fourth electric field sensor measures is a fourth initial electric field intensity $E_4$ in the electric field sensitive direction which is horizontal to the left. If the electric field sensitive direction is perpendicularly downward, then what the electric field sensors measure are initial electric field intensities in the electric field sensitive direction which is perpendicular downward.

In the above embodiment, the calculation method for the voltage of the to-be-measured wire is provided, and specific calculation steps are described below. In an embodiment, as shown in FIG. 4, the step S260 includes following steps.

S262: a second corresponding relationship between the voltage of the to-be-measured wire and the external interference electric field intensity in the electric field sensitive direction is calculated according to the at least four initial electric field intensities, the distances among the at least four electric field sensors along the straight line, the first corresponding relationship, and the spatial position relationship of the at least four electric field sensors.

The spatial positions of the at least four electric field sensors include a perpendicular distance and an included angle between each electric field sensor and the to-be-measured wire. For example, four electric field sensors are taken as an example, the perpendicular distance between the first electric field sensor and the to-be-measured wire is a first perpendicular distance $x_1$; the perpendicular distance between the second electric field sensor and the to-be-measured wire is a second perpendicular distance $x_2$; the perpendicular distance between the third electric field sensor and the to-be-measured wire is a third perpendicular distance $x_3$; and the perpendicular distance between the fourth electric field sensor and the to-be-measured wire is a fourth perpendicular distance $x_4$. Supposing that a common perpendicular line segment between a current-carrying wire and the straight line where the electric field sensors are located is denoted as d; a plane passing through the straight line where the electric field sensor chip is located and perpendicular to the common perpendicular line segment dis denoted as s, then the above included angles also include $\theta_1$, $\theta_2$, $\theta_3$, $\theta_4$, which respectively represent a first included angel between a perpendicular line from the first electric field sensor to the current-carrying wire and the plane s, a second included angel between a perpendicular line from the second electric field sensor to the current-carrying wire and the plane s, a third included angel between a perpendicular line from the third electric field sensor to the current-carrying wire and the plane s, and a fourth included angel between a perpendicular line from the fourth electric field sensor to the current-carrying wire and the plane s. An included angle between the current-carrying wire and a normal plane of the straight line where the electric field sensor is located is denoted as $\alpha$. The spatial position relationship of the at least four electric field sensors, i.e., the spatial position relationship of $x_1$, $x_2$, $x_3$, $x_4$ and $\theta_1$, $\theta_2$, $\theta_3$, $\theta_4$, can be obtained through the space geometry law.

Specifically, the calculation of the second corresponding relationship needs to use the above-mentioned at least four initial electric field intensities, the distances among the at least four electric field sensors along the straight line, the first corresponding relationship and the spatial position relationship of the above-mentioned at least four electric field sensors. In the specific calculation process, the specific situation in FIG. 3 is taken as an example, the process includes the following steps.

At the first step: when the to-be-measured wire is arranged at an inclination with respect to the electric field sensor, there is an included angle between the to-be-measured wire and the voltage sensor. Thus, in the following calculation, it is assumed that the angle $\theta_1$ is less than 90°, while angles $\theta_2$, $\theta_3$, $\theta_4$ are greater than 90°. In the actual measurement, the electric field sensor can only measure the initial electric field intensity in the electric field sensitive direction. The initial electric field intensity in the electric field sensitive direction includes an electric field intensity of the to-be-measured wire in the electric field sensitive direction and an interference electric field intensity in the electric field sensitive direction. Since a distance between an external interference electric field source and the sensor is greater than a distance between the chip and the to-be-measured wire, the external interference electric field is consistent at the four chips, and has a component denoted as $-E_0$ in the direction of the sensitive axis of the chip. Then the initial electric field intensity measured by the electric field sensor can be expressed by the following formula:

For the sake of calculation, let $$V = V_x / \ln\frac{x_0}{R},$$

$$\frac{V \cos\theta_1 \cos\alpha}{x'_1} = E_1 + E_0, \qquad (1-4)$$

$$\frac{V \cos\theta_2 \cos\alpha}{x'_2} = E_2 + E_0, \qquad (1-5)$$

$$\frac{V \cos\theta_3 \cos\alpha}{x'_3} = E_3 + E_0, \qquad (1-6)$$

$$\frac{V \cos\theta_4 \cos\alpha}{x'_4} = E_4 + E_0. \qquad (1-7)$$

At the second step, since the distances among the electric field sensors can be acquired, the spatial position relationship of at least four electric field sensors can be obtained according to the spatial geometry law as follows:

$$x'_1 \sin\theta_1 = x'_2 \sin\theta_2 = x'_3 \sin\theta_3 = x'_4 \sin\theta_4, \qquad (1-8)$$

$$\frac{x'_1 \cos\theta_1}{\cos\alpha} - \frac{x'_2 \cos\theta_2}{\cos\alpha} = m, \qquad (1-9)$$

$$\frac{x'_1 \cos\theta_1}{\cos\alpha} - \frac{x'_3 \cos\theta_3}{\cos\alpha} = n, \qquad (1-10)$$

$$\frac{x'_1 \cos\theta_1}{\cos\alpha} - \frac{x'_4 \cos\theta_4}{\cos\alpha} = k. \qquad (1-11)$$

At the third step: the second corresponding relationship is calculated according to the initial electric field intensity and the spatial position relationship. Firstly, a relationship between each perpendicular distance and each included angle is obtained, for example, a relationship between the first perpendicular distance and the first included angle is obtained, and then the relationship between each perpendicular distance and each included angle is substituted into the corresponding spatial position relationship; through the calculation, a quantity related to the perpendicular distance and the included angle can be eliminated, and the second corresponding relationship between the voltage of the to-be-measured wire and the external interference electric field intensity in the electric field sensitive direction can be obtained. Different second corresponding relationships can be obtained through several different initial electric field intensities and spatial positional relationships. For example, one second corresponding relationship can be obtained from initial electric field intensities of any at least three electric field sensors and spatial position relationships thereof. Another second corresponding relationship can be obtained from initial electric field intensities of other at least three electric field sensors and spatial position relationships thereof.

S264: the voltage of the to-be-measured wire is calculated according to the second corresponding relationship.

Specifically, the second corresponding relationship between the voltage of the to-be-measured wire and the external reference electric field intensity in the electric field sensitive direction can be obtained through the initial electric field intensities of any three electric field sensors and the spatial position relationships thereof. Since the unknown quantities in the second corresponding relationship only include the voltage of the to-be-measured wire and the external interference electric field intensity in the sensitive direction, once the electric field intensity of the interference electric field is determined, the voltage of the to-be-measured wire can be obtained. The method for calculating the voltage of the to-be-measured wire may include that the obtained multiple second corresponding relationships are combined and solved simultaneously, for example, the interference electric field intensity is solved first and then is substituted back to another second corresponding relationship to obtain the voltage of the to-be-measured wire. Alternatively, the voltage of the to-be-measured wire can also be obtained by a one-dimensional search method, and of course other methods can be utilized to calculate the voltage of the to-be-measured wire.

In the embodiment, by calculating the second corresponding relationship between the voltage of the to-be-measured wire and the external interference electric field intensity in the electric field sensitive direction, the spatial position relationship between the to-be-measured wire and the electric field sensor can be eliminated, that is to say, the spatial position relationship between the to-be-measured wire and the electric field sensor does not affect the calculation of the voltage to be measured. Further, the unknown quantities contained in the second corresponding relationship are only the interference electric field intensity in the sensitive direction and the voltage of the to-be-measured wire, that is to say, the voltage of the to-be-measured wire can be obtained once the interference electric field intensity in the sensitive direction is determined. Therefore, the calculation method is simple when such voltage measurement method is utilized to calculate the voltage.

Figure 5:
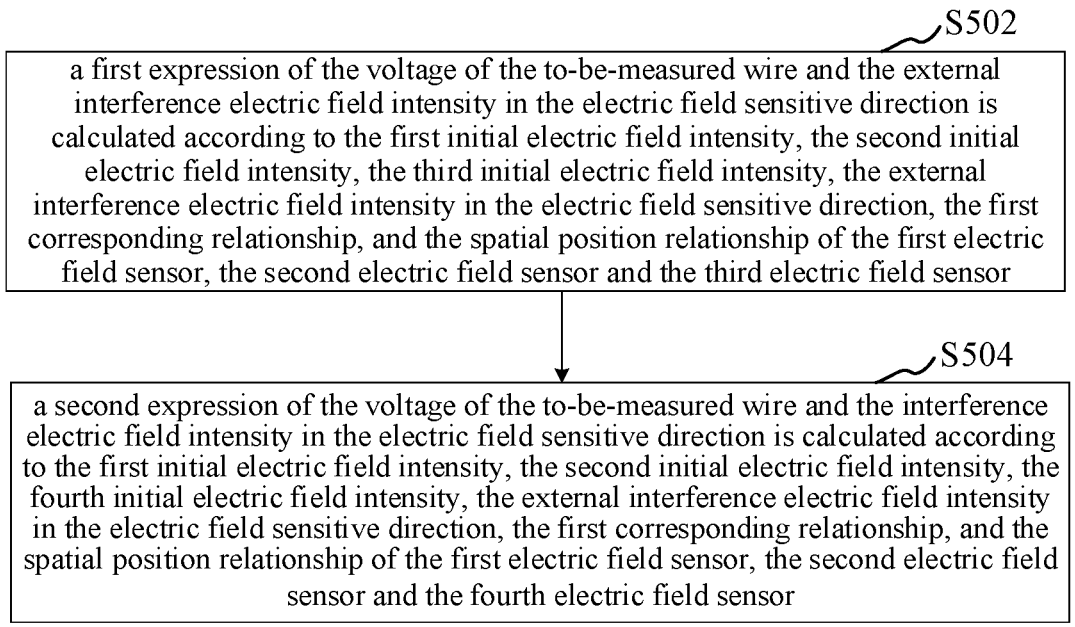
FIG. 5 is a flow chart showing a method for calculating a second corresponding relationship between the voltage of the to-be-measured wire and an external interference electric field intensity in an electric field sensitive direction according to the at least four initial electric field intensities, the distances among the at least four electric field sensors along the straight line, the first corresponding relationship and a spatial position relationship between at least four electric field sensors in FIG. 4.

In the above-mentioned embodiment, the second corresponding relationship is introduced, and the detailed calculation process of the second corresponding relationship is provided below. In an embodiment, as shown in FIG. 5, the step of calculating the second corresponding relationship between the voltage of the to-be-measured wire and the external interference electric field intensity in the electric field sensitive direction according to the at least four initial electric field intensities, the external interference electric field intensity in the electric field sensitive direction, the first corresponding relationship, and the spatial position relationship of the at least four electric field sensors, includes the following steps.

S502: a first expression related to the voltage of the to-be-measured wire and the external interference electric field intensity in the electric field sensitive direction is calculated according to the first initial electric field intensity, the second initial electric field intensity, the third initial electric field intensity, the external interference electric field intensity in the electric field sensitive direction, the first corresponding relationship, and the spatial position relationship of the first electric field sensor, the second electric field sensor and the third electric field sensor.

Specifically, the relationship of the first initial electric field intensity, the second initial electric field intensity, the third initial electric field intensity, and the external interference electric field intensity in the electric field sensitive direction is expressed by the formula (1-4), the formula (1-5), and the formula (1-6). The first corresponding relationship is expressed by the formula (1-3). The spatial position relationship of the first electric field sensor, the second electric field sensor, and the third electric field sensor is expressed by the formula (1-8), the formula (1-9), and the formula (1-10). The above formulas can be utilized to calculate the first expression related to the voltage of the to-be-measured wire and the external interference electric field intensity in the electric field sensitive direction, and the specific calculation process is provided as follows.

At the first step: in order to simplify the operation, the above formulas are rewritten as follows:

Let:

$$\frac{x'_1}{\cos \alpha} = x_1 \quad (1\text{-}12)$$

$$\frac{x'_2}{\cos \alpha} = x_2$$

$$\frac{x'_3}{\cos \alpha} = x_3$$

$$\frac{x'_4}{\cos \alpha} = x_4,$$

then, the formulas (1-4), (1-5), (1-6), (1-8), (1-9) and (1-10) can be respectively rewritten as:

$$\frac{V \cos \theta_1}{x_1} = E_1 + E_0, \quad (1\text{-}13)$$

$$\frac{V \cos \theta_2}{x_2} = E_2 + E_0, \quad (1\text{-}14)$$

$$\frac{V \cos \theta_3}{x_3} = E_3 + E_0, \quad (1\text{-}15)$$

$$x_1 \sin \theta_1 = x_2 \sin \theta_2 = x_3 \sin \theta_3 = x_4 \sin \theta_4, \quad (1\text{-}16)$$

$$x_1 \cos \theta_1 - x_2 \cos \theta_2 = m, \quad (1\text{-}17)$$

$$x_1 \cos \theta_1 - x_3 \cos \theta_3 = n. \quad (1\text{-}18)$$

At the second step, the above formulas (1-13) to (1-18) are combined to obtain:

$$\cos \theta_1 = \frac{(E_1 + E_0)x_1}{V}, \quad (1\text{-}19)$$

$$\cos \theta_2 = \frac{(E_2 + E_0)x_2}{V}, \quad (1\text{-}20)$$

$$\cos \theta_3 = \frac{(E_3 + E_0)x_3}{V}, \quad (1\text{-}21)$$

$$\frac{(E_1 + E_0)x_1^2}{V} - \frac{(E_2 + E_0)x_2^2}{V} = m, \quad (1\text{-}22)$$

$$\frac{(E_1 + E_0)x_1^2}{V} - \frac{(E_2 + E_0)x_3^2}{V} = n. \quad (1\text{-}23)$$

At the third step, the formulas (1-16), (1-17) and (1-18) are combined to obtain:

$$x_1^2 = m^2 + x_2^2 + \frac{2m(E_2 + E_0)x_2^2}{V}. \quad (1\text{-}24)$$

The formulas (1-16), (1-18) and (1-21) are combined to obtain:

$$x_1^2 = n^2 + x_3^2 + \frac{2n(E_3 + E_0)x_3^2}{V}. \tag{1-25}$$

Bu the formulas (1-22) and (1-23), it can be obtained that:

$$(E_1+E_0)x_1^2 - mV = (E_2+E_0)x_2^{2'} \tag{1-26}$$

$$(E_1+E_0)x_1^2 - nV = (E_3+E_0)x_3^{2'} \tag{1-27}$$

At the fourth step, the formulas (1-24) to (1-27) are combined to obtain:

$$\frac{mV + m^3(E_2 + E_0)}{(E_2 + E_0)V - (E_1 + E_0)V - 2m(E_1 + E_0)(E_2 + E_0)} = \frac{nV + n^2(E_3 + E_0)}{(E_3 + E_0)V - (E_1 + E_0)V - 2n(E_1 + E_0)(E_3 + E_0)}. \tag{1-28}$$

The formula (1-28) is the first expression related to the voltage of the to-be-measured wire and the interference electric field intensity in the electric field sensitive direction.

S504: a second expression related to the voltage of the to-be-measured wire and the interference electric field intensity in the electric field sensitive direction is calculated according to the first initial electric field intensity, the second initial electric field intensity, the fourth initial electric field intensity, the external interference electric field intensity in the electric field sensitive direction, the first corresponding relationship, and the spatial position relationship of the first electric field sensor, the second electric field sensor and the fourth electric field sensor.

Specifically, the calculation method for the second expression related to the voltage of the to-be-measured wire and the interference electric field intensity in the electric field sensitive direction is similar to the calculation method for the first expression. By using the formulas (1-4), (1-5), (1-7), (1-8), (1-9), and (1-11), according to the same calculation method as the first expression, the second expression can be obtained and the second expression is as follows:

$$\frac{mV + m^3(E_2 + E_0)}{(E_2 + E_0)V - (E_1 + E_0)V - 2m(E_1 + E_0)(E_2 + E_0)} = \frac{kV + k^2(E_4 + E_0)}{(E_4 + E_0)V - (E_1 + E_0)V - 2k(E_1 + E_0)(E_4 + E_0)}. \tag{1-29}$$

In the embodiment, the specific calculation method for the second corresponding relationship is introduced, in which the first expression and the second expression in the second corresponding relationship can be obtained by using any three electric field sensors and related data thereof. In addition, other second expressions can be obtained by replacing with other electric field sensors and related data thereof, so that such calculation method has a high selectivity in calculation. Meanwhile, by jointly calculating the voltage of the to-be-measured wire by the first expression and the second expression, the accuracy of the calculated voltage of the to-be-measured wire can also be guaranteed.

Figure 6:
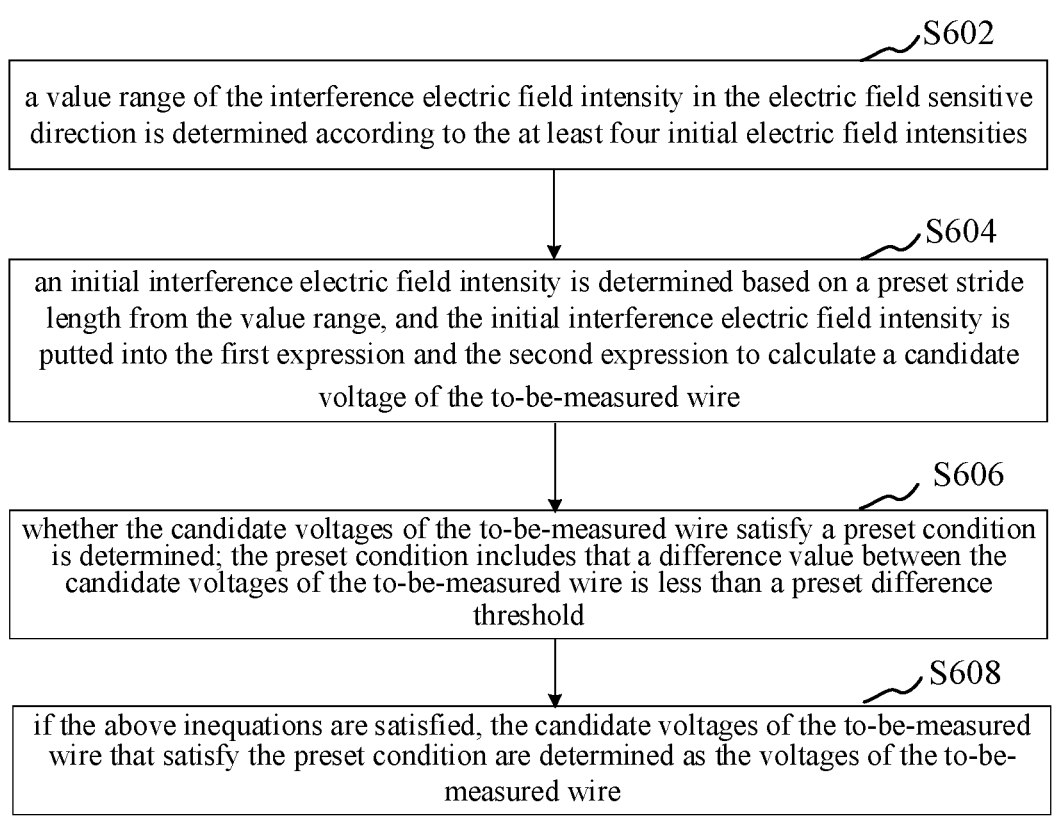
FIG. 6 is a flow chart showing a method for calculating a voltage of a to-be-measured wire according to the second corresponding relationship in FIG. 4.

The above embodiment describes that the second corresponding relationship includes the first expression and the second expression, and the above embodiment introduces the calculation methods for the first expression and the second expression. After that, the process of calculating the voltage of the to-be-measured wire according to the second corresponding relationship is introduced below. In an embodiment, as shown in FIG. 6, the step of calculating the voltage of the to-be-measured wire according to the second corresponding relationship includes the following steps.

S602: a value range of the interference electric field intensity in the electric field sensitive direction is determined according to the at least four initial electric field intensities.

Specifically, the at least four electric field sensors can measure at least four initial electric field intensities; since the initial electric field intensity includes the electric field intensity of the wire in the electric field sensitive direction and the interference electric field intensity in the electric field sensitive direction, that is, the interference electric field intensity in the electric field sensitive direction is smaller than the measured initial electric field intensity. Meanwhile, since the electric field intensity is directional, which may be along the electric field sensitive direction or an opposite direction of the electric field sensitive direction, the value range of the interference electric field intensity in the electric field sensitive direction is within a positive-negative interval of an absolute value of the maximum initial electric field intensity. Firstly, the maximum value $E_{max}$ of the measured four electric field intensities, where $E_{max}=\max|\{E_1, E_2, E_3, E_4\}|$, then the interference electric field intensity $E_0$ in the electric field sensitive direction is denoted as $E_0 = -E_{max}$.

S604: an initial interference electric field intensity is determined based on a preset stride length from the value range, and the initial interference electric field intensity is putted into the first expression and the second expression to calculate a candidate voltage of the to-be-measured wire.

The value range of the interference electric field intensity in the electric field sensitive direction should be within the positive-negative interval of the absolute value of the maximum initial electric field intensity. Assuming that the preset stride length is $\Delta E$, then the initial interference electric field intensity can be denoted as $E_0 = -E_{max} + \Delta E$; after the initial interference electric field intensity is determined, the initial interference electric field intensity is substituted into the first expression to obtain two candidate voltages of the to-be-measured wire; and the initial interference electric field intensity is substituted into the second expression to obtain two candidate voltages of the to-be-measured wire. The candidate voltages obtained by the first expression are approximate to the candidate voltages obtained by the second expression in theory.

Specifically, the candidate voltages of the to-be-measured wire can be calculated and obtained by the following steps.

At the first step, the first expression is simplified to obtain:

$$a_1V^2 + b_1V + c_1 = 0$$

$$a_1 = m(E_1 - E_3) - n(E_1 - E_2)$$

$$b_1 = 2mn(E_1+E_0)(E_3-E_2) + m^2(E_2+E_0)(E_1-E_3) - n^2(E_3+E_0)(E_1-E_2)$$

$$c_1 + 2(m-n)mn(E_1+E_0)(E_2+E_0)(E_2+E_0) = 0 \tag{1-30}$$

the second expression, i.e., the formula (1-29) is simplified to obtain:

$$a_2V^2 + b_2V + c_2 = 0$$

$$a_1 = m(E_1 - E_4) - p(E_1 - E_2)$$

$$b_1=2mp(E_1+E_0)(E_4-E_2)+m^2(E_2+E_0)(E_1-E_4)-p^2(E_4+E_0)(E_1-E_2)$$

$$c_1+2(m-p)mp(E_1+E_0)(E_2+E_0)(E_2+E_0)=0 \quad (1\text{-}31)$$

At the second step, the equation $E_0=-E_{max}+\Delta E$ is substituted into the formula (1-30) to obtain:

$$V_1=\frac{-b_1\pm\sqrt{b_1^2-4a_1c_1}}{2a_1}; \quad (1\text{-}32)$$

the equation $E_0=-E_{max}+\Delta E$ is substituted into the formula (1-31) to obtain:

$$V_2=\frac{-b_2\pm\sqrt{b_2^2-4a_2c_2}}{2a_2}. \quad (1\text{-}33)$$

The formula (1-32) has two solutions, which are denoted as $V_{11}$ and $V_{12}$; and the formula (1-33) has two solutions, which are denoted as $V_{21}$ and $V_{22}$. Theoretically, the voltage of the to-be-measured wire has only one value, that is to say, the candidate voltage of the to-be-measured wire obtained through the first expression is the same as the candidate voltage obtained through the second expression. Therefore, the candidate voltages of the to-be-measured wire are combined to obtain four groups of candidate voltages, which are respectively denoted as:

$$\{V_{11},V_{21}\},\{V_{11},V_{22}\},\{V_{12},V_{21}\},\{V_{12},V_{22}\}$$

S606: whether the candidate voltages of the to-be-measured wire satisfy a preset condition is determined; the preset condition includes that a difference value between the candidate voltages of the to-be-measured wire is less than a preset difference threshold.

Specifically, the candidate voltages are the possible voltages of the to-be-measured wire. In theory, two candidate voltages in one group of candidate voltages are approximately equal. Therefore, the candidate voltages of the to-be-measured wire are determined by setting the preset condition. The preset difference threshold of the to-be-measured wire is set as $\Delta V$, which can be set according to the actual situation, for example, set to be 0.01V, 0.001V, etc. In the specific determination, a subtraction is performed on the values of the two candidate voltages in each group of candidate voltages, and it is determined whether the preset condition that the difference value between the candidate voltages is less than the preset difference threshold is satisfied, that is, it is determined whether the following inequations are satisfied:

$$|V_{11}-V_{21}|\le\Delta V, |V_{11}-V_{22}|\le\Delta V, |V_{12}-V_{21}|\le\Delta V, |V_{12}-V_{22}|\le\Delta V$$

S608: if the above inequations are satisfied, the candidate voltages of the to-be-measured wire that satisfy the preset condition are determined as the voltages of the to-be-measured wire.

Specifically, if the candidate voltages of the to-be-measured wire satisfy the preset condition, it means that the values of the two candidate voltage in the group of candidate voltages are very close, and the values of the two candidate voltages are respectively obtained through the first expression and the second expression, then it can be considered that the two candidate voltages are voltages of the to-be-measured wire, and any one of the candidate voltages can serve as the voltage of the to-be-measured wire. Therefore, if there is a candidate voltage of the to-be-measured wire that satisfies the preset condition in the four groups of candidate voltages, the candidate voltage can serve as the voltage of the to-be-measured wire.

In the embodiment, by limiting the intensity of the interference electric field, the one-dimensional search method is utilized to determine the voltage of the to-be-measured wire. Compared to a method of calculating the voltage of the to-be-measured wire through solving an expression, this method is simpler. Therefore, it is also easier to calculate the voltage of the to-be-measured wire based on the method.

Figure 7:
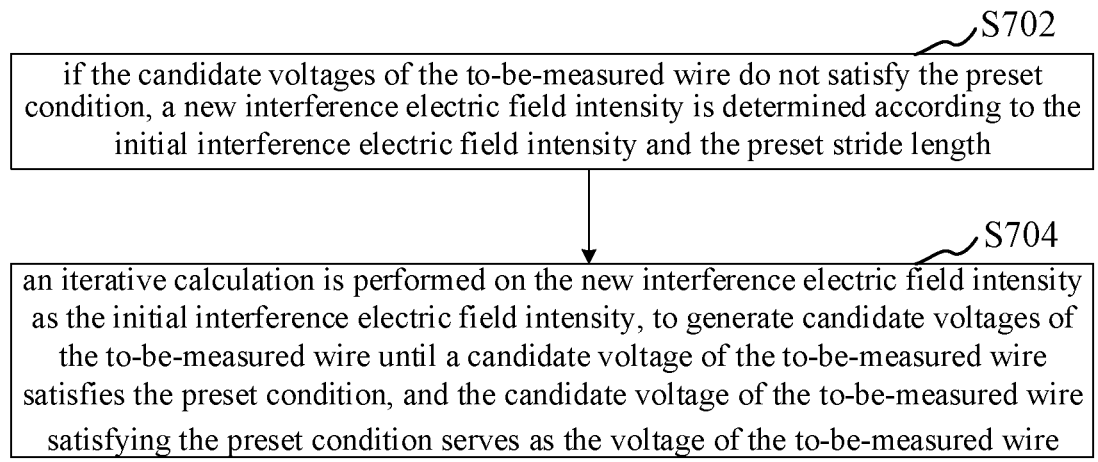
FIG. 7 is a schematic diagram showing a wire voltage measurement method according to an embodiment.

The above embodiment introduces one situation of calculating the voltage of the to-be-measured wire, and another situation is described below. In an embodiment, as shown in FIG. 7, the above method further includes:

S702: if the candidate voltages of the to-be-measured wire dissatisfy the preset condition, a new interference electric field intensity is determined according to the initial interference electric field intensity and the preset stride length.

Specifically, the value range of the interference electric field intensity in the electric field sensitive direction is within the positive-negative interval of the absolute value of the maximum initial electric field intensity, and the initial interference electric field satisfies $E_0=-E_{max}+\Delta E$, that is to say, the interference electric field intensity in the electric field sensitive direction is set according to the specific situation, thus there may be a certain difference between the set value and the actual interference electric field intensity. Then, when the initial interference electric field intensity determined based on the preset stride length is substituted into the second corresponding relationship to obtain the voltage of the to-be-measured wire, the calculated multiple groups of candidate voltages may not satisfy the preset condition. Therefore, when the candidate voltages of the to-be-measured wire dissatisfy the preset condition, it is necessary to determine a new interference electric field intensity according to the initial interference electric field intensity and the preset stride length.

Since the interference electric field intensity in the electric field sensitive direction is theoretically less than the measured initial electric field intensity, when none of the four groups of candidate voltages satisfies the preset condition, the set initial interference electric field intensity is compared to the maximum value of the initial electric field intensities, i.e., it is determined whether the inequation $E_0 \le E_{max}$ is satisfied. When the inequation is satisfied, it means that there may be an error in the calculation process, and the candidate voltages are recalculated; when the inequation is not satisfied, it means that the preset stride length is too large, and it is reset that $\Delta E=\Delta E/2$ at the moment.

S704: an iterative calculation is performed on the new interference electric field intensity as the initial interference electric field intensity, to generate candidate voltages of the to-be-measured wire until a candidate voltage of the to-be-measured wire satisfies the preset condition, and the candidate voltage of the to-be-measured wire satisfying the preset condition serves as the voltage of the to-be-measured wire.

Specifically, the new interference electric field intensity is equal to the sum of a maximum value of the absolute values of the electric field intensities and the newly set stride length, that is, $E_0=-E_{max}+\Delta E/2$; the new interference electric field intensity is substituted into the formula (1-32) and the formula (1-33) to obtain four candidate voltages of the to-be-measured wire; then the four candidate voltages are combined to obtain four groups of candidate voltages; it is determined whether the above four groups of candidate voltages satisfy the preset condition; if the preset condition is satisfied, the candidate voltage of the to-be-measured wire serves as the voltage of the to-be-measured wire; if the preset condition is not satisfied, the preset stride length is reset, and the candidate voltages of the to-be-measured wire are recalculated until the preset condition is satisfied.

In the embodiment, by supplementing the case where the candidate voltages of the to-be-measured wire dissatisfy the preset condition, the possibility of errors in the voltage calculation can be avoided; meanwhile by resetting the preset stride length and repeating the above-mentioned calculation steps, the voltage value of the to-be-measured wire can also be obtained more quickly.

Figure 8:
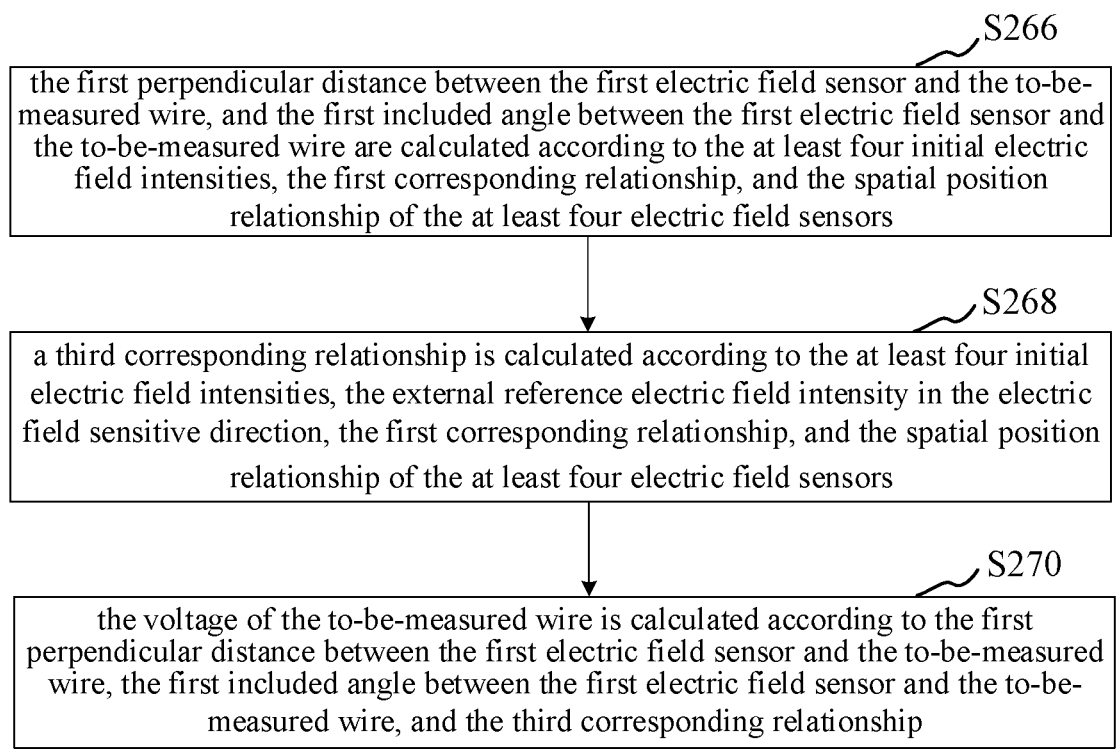
FIG. 8 is a flow chart showing a method for calculating a voltage of a to-be-measured wire according to the at least four initial electric field intensities, the distances among the at least four electric field sensors along the straight line, and the first corresponding relationship in FIG. 2.

In the above embodiment, when the voltage sensor is arbitrarily arranged relative to the to-be-measured wire, the calculation method for the voltage of the to-be-measured wire is provided as follows in which the electric field sensors are arranged on a plane perpendicular to the to-be-measured wire. Of course, when the wire is arranged arbitrarily, it also includes the case where the wire electric field sensors are arranged on the plane perpendicular to the to-be-measured wire. Therefore, the voltage of the to-be-measured wire can also be calculated by using the above calculation method for the to-be-measured wire. Another method for calculating the wire voltage when the electric field sensors are arranged on a plane perpendicular to the to-be-measured wire is provided below. In another embodiment, the above-mentioned at least four electric field sensors are arranged on a plane perpendicular to the to-be-measured wire. As shown in FIG. 8, the step S260 includes following steps.

S266: the first perpendicular distance between the first electric field sensor and the to-be-measured wire, and the first included angle between the first electric field sensor and the to-be-measured wire are calculated according to the at least four initial electric field intensities, the first corresponding relationship, and the spatial position relationship of the at least four electric field sensors.

Figure 9:
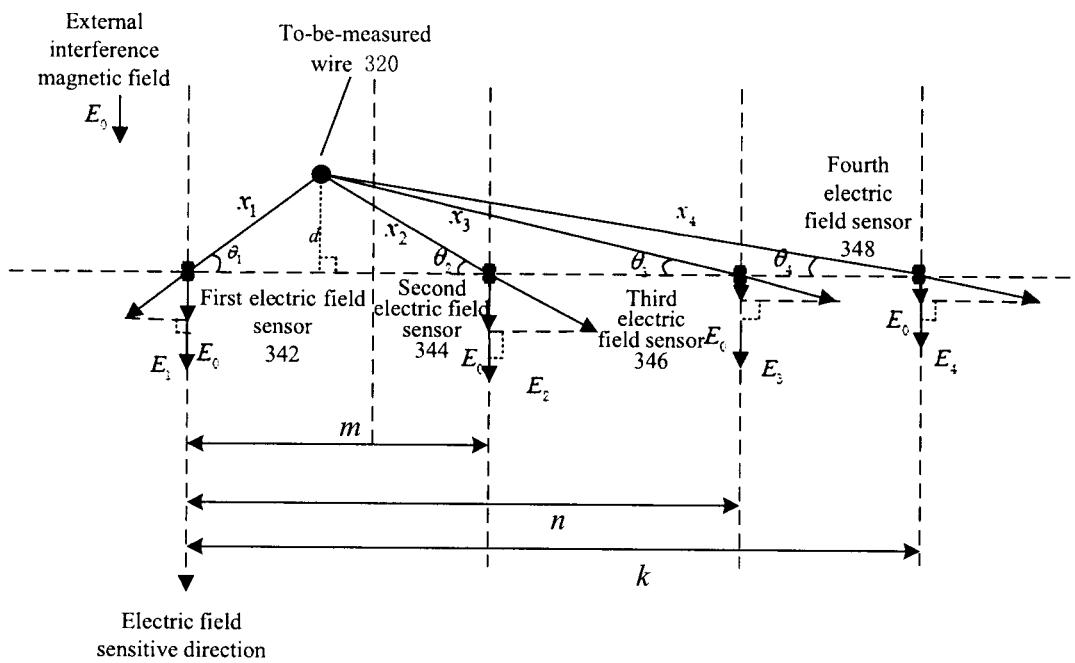
FIG. 9 is a flow chart showing a wire voltage measurement method according to another embodiment.

FIG. 9 is a schematic diagram showing a wire voltage measurement method according to an embodiment. In the FIG. 9, a wire 320 to be measured is included; and the at least four electric field sensors include a first electric field sensor 342, a second electric field sensor 344, a third electric field sensor 346, and a fourth electric field sensor 348. The first electric field sensor 342, the second electric field sensor 344, the third electric field sensor 346, and the fourth electric field sensor 348 are arranged along the same straight line; and the at least four electric field sensors are arranged on the plane perpendicular to the to-be-measured wire.

The spatial position relationship of the at least four electric field sensors include a perpendicular distance between each electric field sensor and the to-be-measured wire, and an included angle between each electric field sensor and the to-be-measured wire. The four electric field sensors are taken as an example, the perpendicular distance between the first electric field sensor and the to-be-measured wire is a first perpendicular distance $x_1$; the included angle between the first electric field sensor and the to-be-measured wire is a first included angle; the perpendicular distance between the second electric field sensor and the to-be-measured wire is a second perpendicular distance $x_2$; the included angle between the second electric field sensor and the to-be-measured wire is a second included angle, and so on. The spatial position relationship of the above four electric field sensors is a spatial position relationship of $x_1$, $x_2$, $x_3$, $x_4$, and $\theta_1$, $\theta_2$, $\theta_3$, $\theta_4$. The above spatial position relationship can be obtained by the spatial geometrical law. In addition, the initial electric field intensity includes the electric field intensity of the wire in the electric field sensitive direction and the interference electric field intensity $E_0$ in the electric field sensitive direction. The first electric field sensor can measure the first initial electric field intensity $E_1$; the second electric field sensor can measure the second initial electric field intensity $E_2$; the third electric field sensor can measure the third initial electric field intensity $E_3$; and the fourth electric field sensor can measure the fourth initial electric field intensity $E_4$.

Specifically, the initial electric field intensity and the first corresponding relationship obtained by the spatial position relationship of the four electric field sensors and the electric field sensors can be acquired from the memory. After the above data is acquired, the data is utilized eliminate $\theta_2$, $\theta_3$, $\theta_4$, $x_2$, $x_3$, and $x_4$ to obtain a relationship between the first perpendicular distance and the first included angle, and then the first perpendicular distance between the first electric field sensor and the to-be-measured wire, and the first included angle between the first electric field sensor and the to-be-measured wire are calculated. Similarly, by the same method for the first perpendicular distance and the first included angle, the perpendicular distance and included angle between any one of the remaining sensors and the to-be-measured wire can also be calculated.

S268: a third corresponding relationship is calculated according to the at least four initial electric field intensities, the external reference electric field intensity in the electric field sensitive direction, the first corresponding relationship, and the spatial position relationship of the at least four electric field sensors.

The third corresponding relationship is a corresponding relationship of the difference value between the first initial electric field intensity and the second initial electric field intensity, the voltage of the to-be-measured wire, a distance between the first electric field sensor and the second electric field sensor, the first perpendicular distance between the first electric field sensor and the to-be-measured wire, and the first included angle between the first electric field sensor and the to-be-measured wire.

As shown in FIG. 9, the electric field sensitive direction is a perpendicular downward direction; and a distance between the external reference electric field source and the electric field sensor is greater than a distance between the to-be-measured wire and the electric field sensor, so that it can be considered that the external interference electric fields at the positions of the multiple electric field sensors are consistent, that is to say, the external interference electric fields in the electric field sensitive direction of the positions of the multiple electric field sensors are consistent; and the electric field intensity in the electric field sensitive direction is denoted as $E_0$.

Specifically, the calculation of the second corresponding relationship can be obtained by calculating the difference value between the initial electric field intensities of any two sensors; and at the same time, through the external reference electric field intensity in the electric field sensitive direction, the first corresponding relationship, and the spatial position relationship of the four electric field sensors, the perpendicular distance and the included angle between the electric field sensor and the to-be-measured wire in the above data is represented by the perpendicular distance and the included angle between one of the electric field sensors and the to-be-measured wire, then the second corresponding relationship can be calculated and obtained. By using the above method, the corresponding relationship of the difference value between the first initial electric field intensity and the second initial electric field intensity, the voltage of the to-be-measured wire, the distance between the first electric field sensor and the second electric field sensor, the first perpendicular distance between the first electric field sensor and the to-be-measured wire, and the first angle between the first electric field sensor and the to-be-measured wire. In addition, by using the same method, a corresponding relationship of a difference value between the first initial electric field intensity and the third initial electric field intensity, the voltage of the to-be-measured wire, a distance between the first electric field sensor and the third electric field sensor, the third perpendicular distance between the third electric field sensor and the to-be-measured wire, and the third included angle between the third electric field sensor and the to-be-measured wire.

S270: the voltage of the to-be-measured wire is calculated according to the first perpendicular distance between the first electric field sensor and the to-be-measured wire, the first included angle between the first electric field sensor and the to-be-measured wire, and the third corresponding relationship.

Specifically, in the above steps, the first perpendicular distance between the first electric field sensor and the to-be-measured wire, and the first included angle between the first electric field sensor and the to-be-measured wire are calculated, and the third corresponding relationship is obtained; further, the unknown quantities in the third corresponding relationship only include the first perpendicular distance, the first included angle and the voltage of the to-be-measured wire, then the first perpendicular distance, the first included angle, the initial electric field intensity measured by the electric field sensor, and the distance between the electric field sensors are inputted into the third corresponding relationship, accordingly the voltage of the to-be-measured wire can be calculated and obtained. In this process, the third corresponding relationship can be pre-stored in the memory, and the processor directly calculates the voltage of the to-be-measured wire according to the third corresponding relationship in the memory, the initial electric field intensity and the distance between the electric field sensors when calculating.

In the embodiment, in the calculation process, it is necessary to use the initial electric field intensities measured by multiple electric field sensors and the external interference electric field intensity in the electric field sensitive direction; since the initial electric field intensity measured by each electric field sensor includes the same external interference electric field intensity, when the third corresponding relationship is calculated, it is only necessary to perform the subtraction on the two initial electric field intensities to eliminate the external interference electric field intensity in the electric field sensitive direction. Based on the above principle, in the subsequent calculation process of the voltage of the to-be-measured wire, the effect of the external interference electric field intensity in the electric field sensitive direction can also be eliminated by the method of calculating the difference value between different initial electric field intensities. Since the effect of the external interference electric field intensity in the electric field sensitive direction is eliminated, the voltage value of the to-be-measured wire finally calculated is more accurate.

In the above embodiment, the calculations of the first perpendicular distance and the first included angle are mentioned, and the specific calculation method for the first perpendicular distance and the first included angle will be described below. In an embodiment, as shown in FIG. 10, the first perpendicular distance between the first electric field sensor and the to-be-measured wire, and the first included angle between the first electric field sensor and the to-be-measured wire are calculated according to the at least four initial electric field intensities, the external interference electric field intensity in the electric field sensitive direction, the first corresponding relationship, and the spatial position relationship of the at least four electric field sensors.

S802: the third expression related to the first perpendicular distance and the first included angle is calculated according to the first initial electric field intensity, the second initial electric field intensity, the third initial electric field intensity, the external interference electric field intensity in the electric field sensitive direction, the first corresponding relationship, and the spatial position relationship of the first electric field sensor, the second electric field sensor, and the third electric field sensor.

It should be noted that the initial electric field intensity measured by the electric field sensor includes the external interference electric field intensity in the electric field sensitive direction and the electric field intensity generated by the to-be-measured wire in the electric field sensitive direction. Accordingly, FIG. 9 is taken as an example, according to Gauss law and the space geometry law, the following formulas can be obtained:

$$\frac{V\sin\theta_1}{x_1} + E_0 = E_1, \quad (1\text{-}34)$$

$$\frac{V\sin\theta_2}{x_2} + E_0 = E_2, \quad (1\text{-}35)$$

$$\frac{V\sin\theta_3}{x_3} + E_0 = E_3, \quad (1\text{-}36)$$

$$x_1\sin\theta_1 = x_2\sin\theta_2 = x_3\sin\theta_3 = x_4\sin\theta_4, \quad (1\text{-}37)$$

$$x_1\cos\theta_1 + x_2\cos\theta_2 = m, \quad (1\text{-}38)$$

$$x_1\cos\theta_1 + x_3\cos\theta_3 = n. \quad (1\text{-}39)$$

Where $$V = V_x / \ln\frac{X_0}{R},$$

and $\theta_1$, $\theta_2$, and $\theta_3$ respectively represent the first included angle between the first electric field sensor and the to-be-measured wire, the second included angle between the second electric field sensor and the to-be-measured wire, and the third included angle between the third electric field sensor and the to-be-measured wire. $x_1$, $x_2$, and $x_3$ respectively represent the first perpendicular distance between the first electric field sensor and the to-be-measured wire, the second perpendicular distance between the second electric field sensor and the to-be-measured wire, and the third perpendicular distance between the third electric field sensor and the to-be-measured wire. $E_0$ represents the external interference electric field intensity in the electric field sensitive direction; $E_1$, $E_2$, and $E_3$ respectively represent the first initial electric field intensity, the second initial electric field intensity, and the third initial electric field intensity in the electric field sensitive direction measured by the first electric field sensor. m represents the distance between the first electric field sensor and the second electric field sensor; n represents the distance between the first electric field sensor and the third electric field sensor.

By eliminating $\theta_2$, $\theta_3$, $E_0$, $x_2$, $x_3$ through the above formulas, the first expression of the first perpendicular distance and the first included angle can be obtained as follows:

$$4E_{23}mn_1{}^2\cos^2\theta_1-(2E_{23}m(n^2+x_1{}^2)x_1+2E_{23}m^2nx_1+E_{12}(2m-2n)x_1{}^3)\cos\theta_1+E_{22}m^2(n^2+x_1{}^2)-E_{12}(n^2-m^2)x_1{}^2=0 \quad (1\text{-}40)$$

$E_{23}$ is the difference value between the second initial electric field intensity and the third initial electric field intensity; and $E_{12}$ is the difference value between the first initial electric field intensity and the second initial electric field intensity.

S804: a fourth expression related to the first perpendicular distance and the first included angle is calculated according to the first initial electric field intensity, the second initial electric field intensity, the fourth initial electric field intensity, the external interference electric field intensity in the electric field sensitive direction, the first corresponding relationship, and the spatial position relationship of the first electric field sensor, the second electric field sensor and the fourth electric field sensor.

In addition to the above formulas (1-34), (1-35), (1-37), and (1-38), the fourth expression of the first perpendicular distance and the first included angle needs to be obtained by means of the following formulas:

$$\frac{V\sin\theta_4}{x_4}+E_0=E_4, \quad (1\text{-}41)$$

$$x_1\cos\theta_1+x_4\cos\theta_4=k, \quad (1\text{-}42)$$

where $\theta_4$ is the fourth included angle between the fourth electric field sensor and the to-be-measured wire; $x_4$ is the fourth perpendicular distance between the fourth electric field sensor and the to-be-measured wire; $E_4$ is the fourth initial electric field intensity in the electric field sensitive direction measured by the fourth electric field sensor; k is the distance between the first electric field sensor and the fourth electric field sensor.

By eliminating $\theta_2$, $\theta_4$, $E_0$, $x_2$, $x_4$ through the above formulas, the fourth expression of the first perpendicular distance and the first included angle can be obtained as follows:

$$(E_{24}m^2)(k^2+x_1{}^2)-E_{12}(k^2-m^2)x_1{}^2)-(E_{24}m^22kx_1+(k^2+x_1{}^2)2E_{24}mx_1+E_{12}(2m-2k)x_1{}^3)\cos\theta_1+4E_{24}mkx_1{}^2\cos^2\theta_1=0, \quad (1\text{-}43)$$

where, $E_{24}$ is the difference value between the second initial electric field intensity and the fourth initial electric field intensity.

S806: the first perpendicular distance between the first electric field sensor and the to-be-measured wire, and the first included angle between the first electric field sensor and the to-be-measured wire are calculated according to the third expression and the fourth expression.

Specifically, the third expression and the fourth expression can be obtained by the above method; and the unknown quantities in the third expression and the fourth expression are only the first perpendicular distance and the first included angle; accordingly, in the calculation method for the first perpendicular distance and the first included angle, $\cos\theta_1$ can be calculated through the first expression, and then $\cos\theta_1$ containing $x_1$ is substituted into the fourth expression to obtain $x_1$; or $x_1$ is first calculated through the third expression, and then the $x_1$ containing $\cos\theta_1$ is substituted into the fourth expression to obtain the $\cos\theta_1$.

In the embodiment, the first perpendicular distance between the first electric field sensor and the to-be-measured wire, and the first included angle between the first electric field sensor and the to-be-measured wire can be calculated; and the effect of the interference electric field can be eliminated through the third expression and the fourth expression. Meanwhile, it can be seen from the above calculation method that only $E_1$, $E_2$, $E_3$, $E_4$, m, n, and k are required to calculate and obtain $x_1$ and $\theta_1$. In view of this, there is no need to acquire the perpendicular distance and included angle between the to-be-measured wire and the electric field sensor in advance, so that there are fewer restrictions on the installation position of the electric field sensor, and the installation process of the electric field sensor is easier, and the wire voltage calculation method is also easier. In addition, the above calculation method can be set in the electric field sensor, so that the first perpendicular distance and the first included angle can be directly calculated after $E_1$, $E_2$, $E_3$, $E_4$, m, n, and k are acquired.

Figure 11:
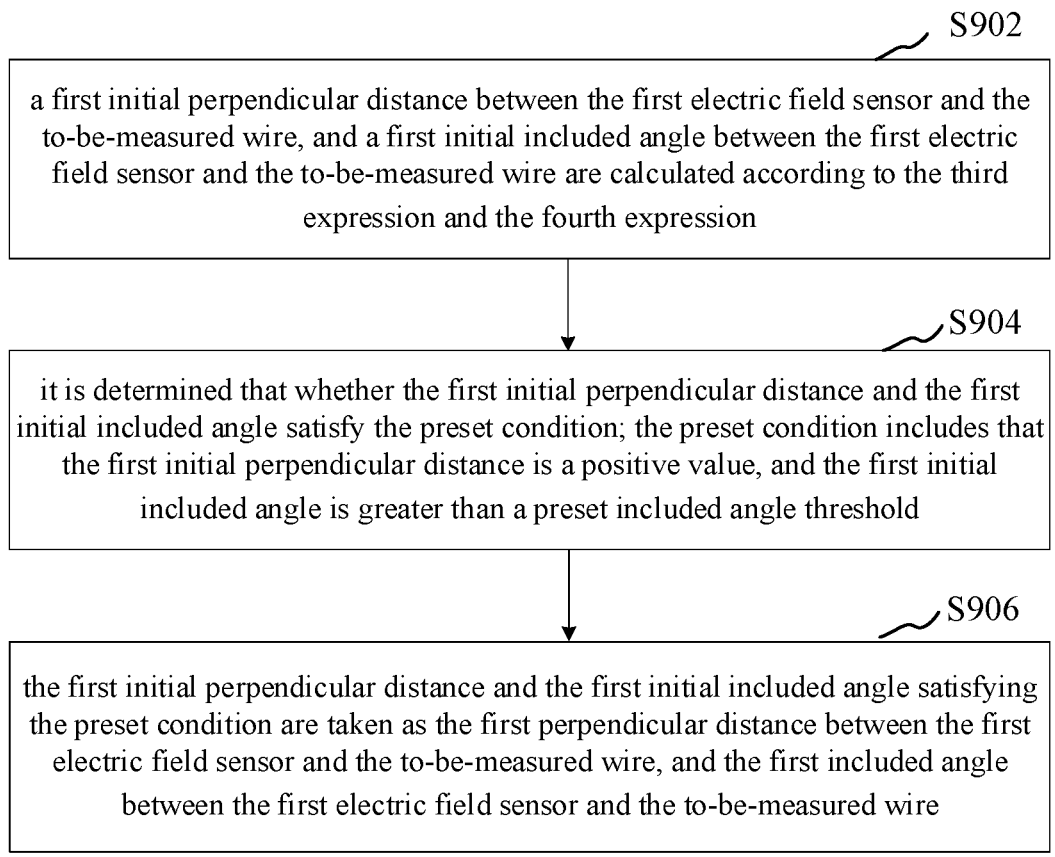
FIG. 11 is a flow chart showing a method for calculating a first perpendicular distance between a first electric field sensor and the to-be-measured wire and a first angle between the first electric field sensor and the to-be-measured wire according to a third expression function and a fourth expression function in FIG. 9.

In the above-mentioned embodiment, it is introduced that the first perpendicular distance between the first electric field sensor and the to-be-measured wire, and the first included angle between the first electric field sensor and the to-be-measured wire can be calculated through the third expression and the fourth expression. The method for determining the obtained first perpendicular distance and the first included angle will be described below. In an embodiment, as shown in FIG. 11, the step of calculating the first perpendicular distance between the first electric field sensor and the to-be-measured wire and the first included angle between the first electric field sensor and the to-be-measured wire according to the third expression and the fourth expression includes the following steps.

S902: a first initial perpendicular distance between the first electric field sensor and the to-be-measured wire, and a first initial included angle between the first electric field sensor and the to-be-measured wire are calculated according to the third expression and the fourth expression.

Since in the third expression and the fourth expression, a degree of $x_1$ is three, then the finally calculated $x_1$ may have multiple results, and correspondingly there are multiple results of $\theta_1$. Actually, $x_1$ denotes the distance between the first electric field sensor and the wire, and $\theta_1$ denotes the included angle between the first electric field sensor and the wire, both of which are certain values. Therefore, the first initial perpendicular distance here includes all $x_1$ obtained by the calculation; and the first initial included angle includes all $\theta_1$ obtained according to all the obtained $x_1$ in the above-mentioned embodiment. The specific solution method below can be adopted.

The formula (1-12) is solved to obtain two solutions of $\cos\theta_1$:

$$\cos\theta_1=\frac{\left(\begin{array}{c}(2B_{23}m(n^2+x_1^2)x_1+2B_{23}m^2nx_1+B_{12}(2m-2n)x_1^3)\\ \pm\sqrt{\begin{array}{c}(2B_{23}m(n^2+x_1^2)x_1+2B_{23}m^2nx_1+B_{12}(2m-2n)x_1^3)^2\\ -16B_{23}mnx_1^2(B_{23}m^2(n^2+x_1^2)-B_{12}(n^2-m^2)x_1^2)\end{array}}\end{array}\right)}{(8B_{23}mnx_1^2)}. \quad (1\text{-}44)$$

According to FIG. 1, since the distance between the to-be-measured wire and the electric field sensor is very small, which means that $\theta_1$ is very small, it can be substantially considered that $\cos\theta_1\approx 1$; so that the positive symbol in the formula (1-44) is taken before substituting the formula (1-44) into (1-43) for simplification.

For the convenience of description, some intermediate variables are introduced here:

$$x = x_1^2$$

$$a_1 = E_{24}m + E_{12}(m-k))E_{23}n - E_{24}k(B_{23}m + E_{12}(m-n))$$

$$a_2 = (E_{24}m^2k + k^2E_{24}m)(E_{23}n) - E_{24}k(E_{22}m^2n + E_{23}mn^2)$$

$$a_3 = 16^2m^2$$

$$b_1 = 4(E_{23}m + E_{12}m - E_{12}n)^2$$

$$b_2 = 4(2(E_{23}mn^2 + E_{23}m^2n)(E_{23}m + E_{12}m - E_{12}n) - 4E_{23}mn(E_{23}m^2 - E_{12}n^2 + E_{12}m^2))$$

$$b_3 = 4((E_{23}mn^2 + E_{23}m^2n)^2 - 4E_{23}mnE_{23}m^2n^2)$$

$$c_1 = 2(E_{23}mn)^2 E_{24}m^2k^3 - 2E_{23}^2 E_{24}km^4n^3$$

$$c_2 = (2(E_{24}m^2 - E_{12}(k^2 - m^2))(E_{23}mn)^2 - 2E_{23}mnE_{24}mk(E_{23}m^2 - E_{12}n^2 + E_{12}m^2))$$

$$c_3 = (E_{23}mn)(E_{24}m^2k + k^2E_{24}m)$$

$$c_4 = E_{23}mn(E_{24}m + E_{12}(m-k))$$

$$c_5 = E_{23}mn^2 + E_{23}m^2n$$

$$c_6 = (E_{23}m + E_{12}m - E_{12}n)$$

$$c_7 = E_{24}mk(E_{23}mn^2 + E_{23}m^2n)$$

$$c_8 = E_{24}mk(E_{23}m + E_{12}(m-n))(1-45)$$

the positive symbol in the formula (1-44) is taken before substituting the formula (1-44) into (1-43) to simply and obtain:

$$0 = [(a_1^2 a_3 b_1) - (c_7 c_9^2 - c_4 c_5)^2]x^4 + [(a_1^2 a_2 b_2 + 2a_1 a_2 a_3 b_1 - 2(c_7 c_9^2 - c_4 c_5)(c_2 - c_3 c_6 - c_4 c_5 + 2c_7 c_8 c_9)]x^3 + [(a_1^2 a_3 b_3 + 2a_1 a_2 a_3 b_2 + a_2^2 a_3 b_1) - (2(c_7 c_9^2 - c_4 c_5)(c_1 - c_3 c_5 + c_7 c_8^2) + c_2 - c_3 c_6 - c_4 c_5 + 2c_7 c_8 c_9)^2]x^2 + [(2a_1 a_2 a_3 b_3 + a_2^2 a_3 b_2) - 2(c_2 - c_3 c_5 - c_4 c_5 + 2c_7 c_8 c_9)(c_1 - c_3 c_5 + c_7 c_8^2)]x + a_2^2 a_3 b_3 - (c_1 - c_3 c_5 + c_7 c_8^2)^2 \quad (1-46)$$

the above formula (1-46) can be represented by the following quartic equations for one variable:

$$0 = ax^4 + bx^3 + cx^2 + dx + e$$

$$a = (a_1^2 a_3 b_1) - (c_7 c_9^2 - c_4 c_6)^2$$

$$b = (a_1^2 a_3 b_2 + 2a_1 a_2 a_3 b_1) - 2(c_7 c_9^2 - c_4 c_5)(c_2 - c_3 c_5 - c_4 c_5 + 2c_7 c_3 c_9)$$

$$c = (a_1^2 a_3 b_3 + 2a_1 a_2 a_3 b_2 + a_2^2 a_3 b_1) - (2(c_7 c_9^2 - c_4 c_5)(c_1 - c_3 c_5 + c_7 c_8^2) + (c_2 - c_3 c_6 - c_4 c_5 + 2c_7 c_8 c_9)^2)$$

$$d = (2a_1 a_2 a_3 b_3 + a_2^2 a_3 b_2) - 2(c_2 - c_3 c_8 - c_4 c_5 + 2c_7 c_8 c_9)(c_1 - c_3 c_5 + c_7 c_8^2)$$

$$e = a_2^2 a_3 b_3 - (c_1 - c_3 c_5 + c_7 c_8^2)^2 (1-47)$$

the formula (1-47) is solved to obtain x; since $x = x_1^2$, then $x_1 = \sqrt{x}$, $x_1$ is substituted into the formula (1-44) to obtain $\theta_1$. The solution of the formula (1-47) can be performed through the following matrix:

$$I = eig \begin{bmatrix} -\frac{b}{a} & -\frac{c}{a} & -\frac{c}{a} & -\frac{e}{a} \\ 1 & & & \\ & 1 & & \\ & & 1 & \end{bmatrix}, \quad (1-48)$$

Where, eig(•) represents to find eigenvectors of the matrix; and four solutions of x can be obtained by solving the quartic equations for one variable.

S904: it is determined that whether the first initial perpendicular distance and the first initial included angle satisfy the preset condition; the preset condition includes that the first initial perpendicular distance is a positive value, and the first initial included angle is greater than a preset included angle threshold.

The preset condition is a condition that the actual first perpendicular distance and the first included angle should satisfy. It can be seen from the above embodiment that the obtained x has four values, then the corresponding $x_1$ also has multiple values. In an actual situation, $x_1$ is the first perpendicular distance between the to-be-measured wire and the electric field sensor, so that only one value is a true value of $x_1$. Similarly, $\theta_1$ obtained through $x_1$ satisfying the condition also has multiple values, and $\theta_1$ has only one true value, and $\theta_1$ is greater than 0°. Meanwhile, because $\theta_1$ is very small, cos $\theta_1$ should be approximate to 1, so that the final obtained $\theta_1$ also satisfy the preset included angle threshold.

Specifically, $x_1$ and $\theta_1$ satisfy the following formulas:

$$x = x_1^2 > 0, \quad (1-49)$$

$$x \neq 0, \frac{\text{imaginary part}}{\text{real part}} < 0.1, \quad (1-50)$$

$$\cos\theta_1 \geq 0.8, \quad (1-51)$$

$$\theta_1 > 0. \quad (1-52)$$

The obtained multiple $x_1$ and $\theta_1$ are determined through the formulas (1-49) to (1-52) to obtain $x_1$ satisfying the positive value and $\theta_1$ satisfying the preset included angle threshold.

The preset condition that the first initial perpendicular distance and the first included angle satisfy can be pre-stored in the memory; and each first initial perpendicular distance and the first included angle are compared to the preset condition that needs to be satisfied to determine whether the preset condition is satisfied.

S906: the first initial perpendicular distance and the first initial included angle satisfying the preset condition are taken as the first perpendicular distance between the first electric field sensor and the to-be-measured wire, and the first included angle between the first electric field sensor and the to-be-measured wire.

Specifically, the first initial perpendicular distance and the first initial included angle that dissatisfy the preset condition are discarded; and one first initial perpendicular distance and one first initial included angle that satisfy the preset condition are respectively denoted as $x_1$ and $\theta_1$ and serve as the first perpendicular distance and the first included angle, respectively. The obtained $x_1$ and $\theta_1$ can be utilized to calculate the voltage of the to-be-measured wire. Similarly, by simply adjusting the above method, the second perpendicular distance and the second included angle, etc., can also be obtained.

In the embodiment, by screening the obtained multiple $x_1$ and $\theta_1$, an accurate value can be obtained, which ensures the accuracy of $x_1$ and $\theta_1$, and the voltage of the to-be-measured wire obtained by further calculation on this basis is also more accurate.

Figure 12:
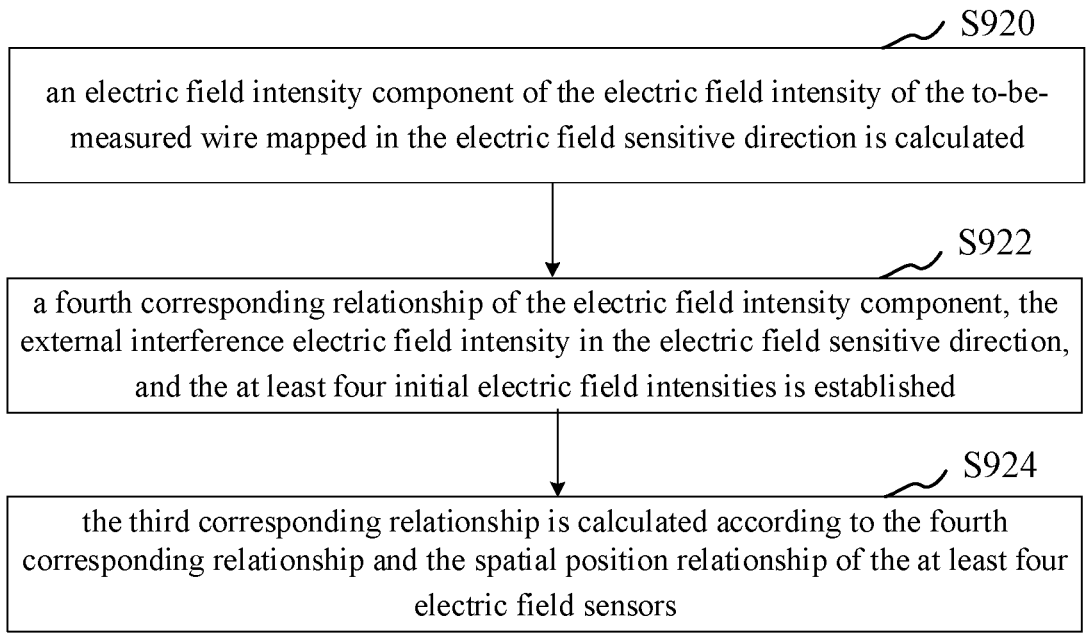
FIG. 12 is flow chart showing a method for calculating a third corresponding relationship between the voltage of the to-be-measured wire and the external interference electric field intensity in the electric field sensitive direction according to the at least four initial electric field intensities, the external interference electric field intensity in the electric field sensitive direction, the first corresponding relationship, and the spatial position relationship between the at least four electric field sensors in FIG. 8.

The above embodiment describes the calculation of the second corresponding relationship according to the at least four initial electric field intensities, the external interference electric field intensity in the electric field sensitive direction, the first corresponding relationship and the spatial position relationship of the at least four electric field sensors. The specific calculation method for the second corresponding relationship will be further introduced below. In an embodiment, as shown in FIG. 12, the step of calculating the third corresponding relationship according to the at least four initial electric field intensities, the external interference electric field intensity in the electric field sensitive direction, the first corresponding relationship, and the spatial position relationship of the at least four electric field sensors includes following steps.

S920: an electric field intensity component of the electric field intensity of the to-be-measured wire mapped in the electric field sensitive direction is calculated.

Specifically, the electric field sensor can only measure the electric field intensity in the electric field sensitive direction, while the electric field intensity of the to-be-measured wire is an electric field intensity in a direction of the first perpendicular distance, so that the electric field intensity measured by the electric field sensor actually includes the electric field intensity component of the electric field intensity of the to-be-measured wire mapped in the electric field sensitive direction; and the electric field intensity component of the electric field intensity of the to-be-measured wire in the electric field sensitive direction can be obtained by using the formula (1-3) and the first included angle. For example: components of the electric field intensities of the to-be-measured wire at the positions of the first electric field sensor and the second electric field sensor mapped in the electric field sensitive direction are respectively represented by the following formulas:

$$E_{1r} = \frac{V_s \sin\theta_1}{x_1 \ln\frac{x_0}{R}}, \quad (1\text{-}53)$$

$$E_{2r} = \frac{V_s \sin\theta_2}{x_2 \ln\frac{x_0}{R}}. \quad (1\text{-}54)$$

S922: a fourth corresponding relationship of the electric field intensity component, the external interference electric field intensity in the electric field sensitive direction, and the at least four initial electric field intensities is established.

Specifically, the electric field intensity measured by the electric field sensor includes the electric field intensity component and the external interference electric field intensity in the electric field sensitive direction. The external interference electric field intensity at the position of each electric field sensor is the same, but the electric field intensity component is different. Therefore, a corresponding relationship of an electric field intensity component, an external interference electric field intensity in the electric field sensitive direction, and the at least four initial electric field intensities can be obtained at the position of each electric field sensor. For example, the third corresponding relationship of the electric field intensity component at the first electric field sensor, the external interference electric field intensity in the electric field sensitive direction and the first initial electric field intensity, and the fourth corresponding relationship of the electric field intensity component at the second electric field sensor, the external interference electric field intensity in the electric field sensitive direction and the first initial electric field intensity are respectively represented by the following formulas:

$$\frac{V_x \sin\theta_1}{x_1 \ln\frac{x_0}{R}} + E_0 = E_1, \quad (1\text{-}55)$$

$$\frac{V_x \sin\theta}{x_2 \ln\frac{x_0}{R}} + E_0 = E_2. \quad (1\text{-}56)$$

S924: the third corresponding relationship is calculated according to the fourth corresponding relationship and the spatial position relationship of the at least four electric field sensors.

Specifically, the third corresponding relationship can be calculated according to the fourth corresponding relationship and the spatial position relationship of the four electric field sensors. Here, the first electric field sensor and the second electric field sensor are taken as example, the calculation of the second corresponding relationship needs to use the formula (1-34), the formula (1-35), the formula (1-38), and the formula (1-39); by calculating the difference between the formula (1-34) and the formula (1-35), the difference value between the first initial electric field intensity and the second initial electric field intensity is obtained; and then the formula (1-38) and the formula (1-39) are used in the simplification process to eliminate $x_2$ and $\theta_2$, then the third corresponding relationship can be obtained. The specific formula is as follows:

$$Vx_1 \sin\theta_1 = E_{12} \bigg/ \left(\frac{1}{x_1^2} - \frac{1}{(m - x_1\cos\theta_1)^2 + (x_1\sin\theta_1)^2}\right). \quad (1\text{-}57)$$

In the embodiment, the electric field intensity measured by the electric field sensor is decomposed into the electric field intensity component of the electric field intensity of the wire mapped in the electric field sensitive direction and the interference electric field intensity, in order to eliminate the effect of the interference electric field intensity. Accordingly, when the second corresponding relationship and the obtained first perpendicular distance and the first included angle are utilized to calculate the voltage of the to-be-measured wire, the obtained voltage of the to-be-measured wire through the calculation is more accurate.

Figure 13:
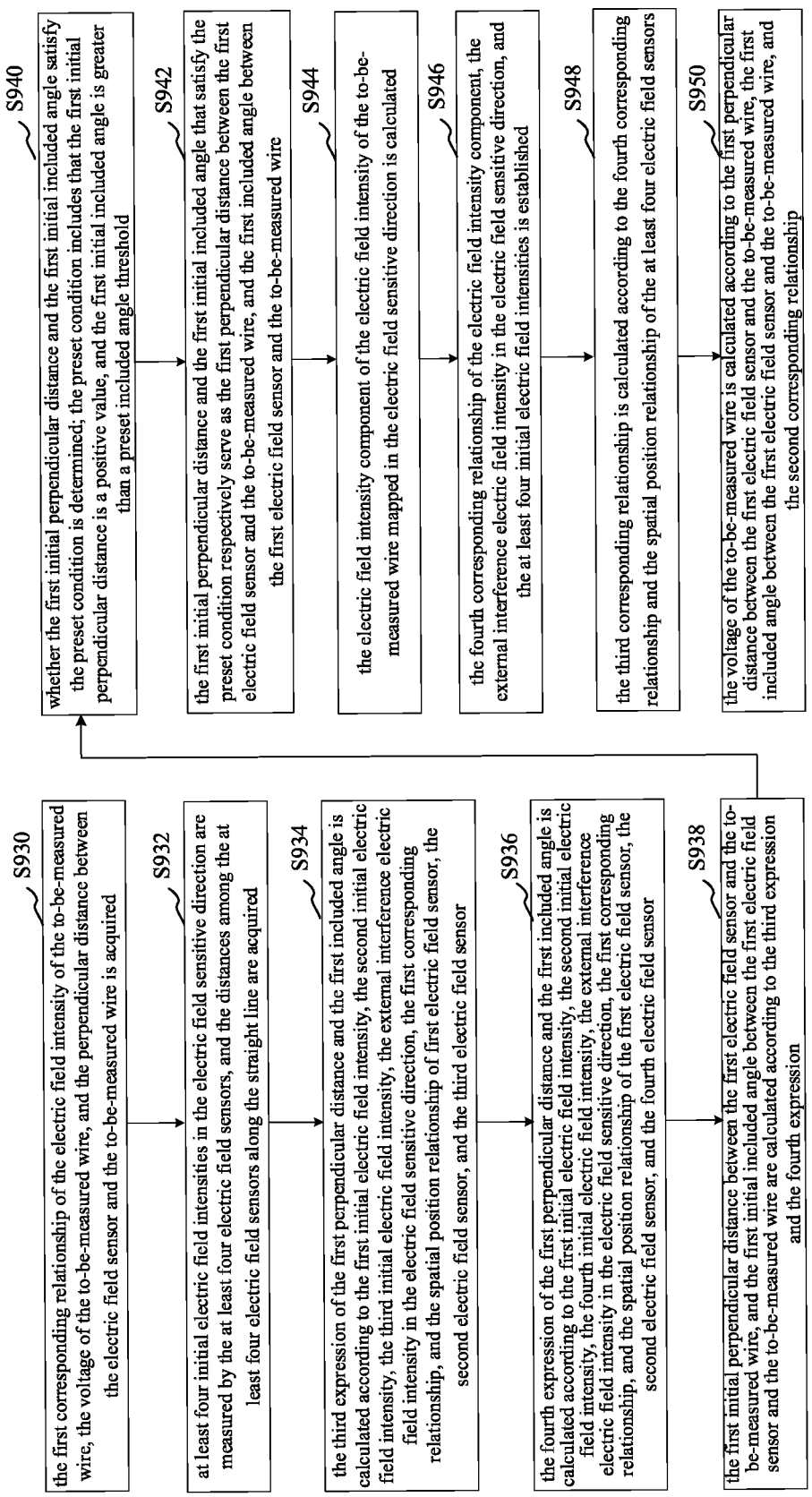
FIG. 13 is a flow chart of a wire voltage measurement method according to an embodiment.

The wire voltage measurement method has been provided above. The wire voltage measurement method will be detailed in conjunction with a specific embodiment as follows. In an embodiment, as shown in FIG. 13, the wire voltage measurement method includes the following steps.

S930: the first corresponding relationship of the electric field intensity of the to-be-measured wire, the voltage of the to-be-measured wire, and the perpendicular distance between the electric field sensor and the to-be-measured wire is acquired.

S932: at least four initial electric field intensities in the electric field sensitive direction are measured by the at least four electric field sensors, and the distances among the at least four electric field sensors along the straight line are acquired.

S934: the third expression related to the first perpendicular distance and the first included angle is calculated according to the first initial electric field intensity, the second initial electric field intensity, the third initial electric field intensity, the external interference electric field intensity in the electric field sensitive direction, the first corresponding relationship, and the spatial position relationship of first electric field sensor, the second electric field sensor, and the third electric field sensor.

S936: the fourth expression related to the first perpendicular distance and the first included angle is calculated according to the first initial electric field intensity, the second initial electric field intensity, the fourth initial electric field intensity, the external interference electric field intensity in the electric field sensitive direction, the first corresponding relationship, and the spatial position relationship of the first electric field sensor, the second electric field sensor, and the fourth electric field sensor.

S938: the first initial perpendicular distance between the first electric field sensor and the to-be-measured wire, and the first initial included angle between the first electric field sensor and the to-be-measured wire are calculated according to the third expression and the fourth expression.

S940: whether the first initial perpendicular distance and the first initial included angle satisfy the preset condition is determined; the preset condition includes that the first initial perpendicular distance is a positive value, and the first initial included angle is greater than a preset included angle threshold.

S942: the first initial perpendicular distance and the first initial included angle that satisfy the preset condition respectively serve as the first perpendicular distance between the first electric field sensor and the to-be-measured wire, and the first included angle between the first electric field sensor and the to-be-measured wire.

S944: the electric field intensity component of the electric field intensity of the to-be-measured wire mapped in the electric field sensitive direction is calculated.

S946: the fourth corresponding relationship of the electric field intensity component, the external interference electric field intensity in the electric field sensitive direction, and the at least four initial electric field intensities is established.

S948: the third corresponding relationship is calculated according to the fourth corresponding relationship and the spatial position relationship of the at least four electric field sensors.

S950: the voltage of the to-be-measured wire is calculated according to the first perpendicular distance between the first electric field sensor and the to-be-measured wire, the first included angle between the first electric field sensor and the to-be-measured wire, and the second corresponding relationship.

In the voltage measurement method of the embodiment, only the initial electric field intensities of the at least four electric field sensors, the distances among the electric field sensors and the first corresponding relationship need to be acquired to calculate the voltage of the to-be-measured wire, that is to say, when the voltage of the to-be-measured wire is calculated, the voltage value of the to-be-measured wire can be obtained without considering the distance between the wire and the electric field sensor and the position angle of the electric field sensor. Since there are fewer restrictions on the arrangement mode of the electric field sensors, and the initial electric field intensities can be acquired by the electric field sensors, and the distances among multiple electric field sensors are also easier to obtain, the voltage value of the to-be-measured wire can be more easily obtained by using the above-mentioned voltage measurement method. In addition, in the above embodiment, it is also required to determine the obtained first perpendicular distance and the first included angle to find out a value that satisfies the requirement. This process can ensure the accuracy of the obtained first perpendicular distance and the first included angle; and then the voltage value of the to-be-measured wire which is obtained based on the first perpendicular distance and the first included angle is also more accurate. The electric field intensities in the above-mentioned embodiment also include the external interference electric field intensity in the electric field sensitive direction. The external interference electric field intensity can be eliminated by the voltage measurement method in the present disclosure, so that a more accurate wire voltage value can be obtained by using wire voltage measurement method in the present disclosure.

It should be appreciated that, although the steps in the flow charts involved in the above embodiments are sequentially displayed according to the arrows, these steps are not definitely executed in the order indicated by the arrows. Unless explicitly stated herein, the execution of these steps is not strictly limited to the order, and the steps may be executed in other orders. Moreover, at least a part of the steps in the flow charts involved in the above embodiments may include multiple steps or multiple stages, and these steps or stages are not definitely executed and completed at the same time, but may be executed at different time. The execution order of these steps or stages is not definitely sequential, but may be performed in turns or alternately with other steps or at least a part of the steps or stages in the other steps.

Based on the same inventive concept, in an embodiment of the present disclosure, a wire voltage measurement apparatus for implementing the above-mentioned wire voltage measurement method is provided. The solution to the problem provided by the apparatus is similar to the solution described in the above method, so that as for the specific limitations in one or more embodiments of the wire voltage measurement apparatus provided below, reference can be made to the wire voltage measurement method described above, which are not repeated here.

Figure 14:
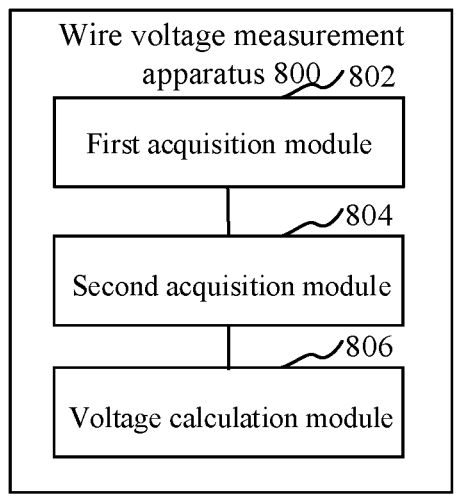
FIG. 14 is a structural block diagram illustrating a wire voltage measurement apparatus according to an embodiment.

In an embodiment, as shown in FIG. 14, a wire voltage measurement apparatus 800 is provided, including: a first acquisition module 802, a second acquisition module 804 and a voltage calculation module 806.

The first acquisition module 802 is configured to acquire the first corresponding relationship of the electric field intensity (in the direction of the oblique line) of the to-be-measured wire, the voltage of the to-be-measured wire, and the perpendicular distance between the electric field sensor and the to-be-measured wire.

The second acquisition module 804 is configured to measure the at least four initial electric field intensities in the electric field sensitive direction through the at least four electric field sensors, and acquire the distances among the at least four electric field sensors along the straight line.

The voltage calculation module 806 is configured to calculate the voltage of the to-be-measured wire according to the at least four initial electric field intensities, the distances among the at least four electric field sensors along the straight line, and the first corresponding relationship.

In an embodiment, the at least four electric field sensors include a first electric field sensor, a second electric field sensor, a third electric field sensor, and a fourth electric field sensor. The first electric field sensor is configured to measure the first initial electric field intensity; the second electric field sensor is configured to measure the second initial electric field intensity; the third electric field sensor is configured to measure the third initial electric field intensity; and the fourth electric field sensor is configured to measure the fourth initial electric field intensity.

In the wire voltage measurement apparatus provided by another embodiment, the voltage calculation module includes:
- a first relationship calculation unit, configured to calculate the second corresponding relationship of the voltage of the to-be-measured wire and the external interference electric field intensity in the electric field sensitive direction according to the at least four initial electric field intensities, the distances among the at least four electric field sensors along the straight line, the first corresponding relationship, and the spatial position relationship of the at least four electric field sensors;
- a voltage calculation unit, configured to calculate the voltage of the to-be-measured wire according to the second corresponding relationship.

In the wire voltage measurement apparatus provided by another embodiment, the first relationship calculation unit includes:
- a first expression calculation subunit, configured to calculate the first expression related to the voltage of the to-be-measured wire and the interference electric field intensity in the electric field sensitive direction according to the first initial electric field intensity, the second initial electric field intensity, the third initial electric field intensity, the external interference electric field intensity in the electric field sensitive direction, the first corresponding relationship and the spatial position relationship of the first electric field sensor, the second electric field sensor, and the third electric field sensor;
- a second expression calculation subunit, configured to calculate the second expression related to the voltage of the to-be-measured wire and the interference electric field intensity in the electric field sensitive direction according to the first initial electric field intensity, the second initial electric field intensity, the fourth initial electric field intensity, the external interference electric field intensity in the electric field sensitive direction, the first corresponding relationship, and the spatial position relationship of the first electric field sensor, the second electric field sensor, and the fourth electric field sensor.

In the wire voltage measurement apparatus provided by another embodiment, the voltage calculation unit includes:
- a value range determination subunit, configured to determine a value range of the interference electric field intensity in the electric field sensitive direction according to the at least four initial electric field intensities;
- a candidate voltage calculation subunit, configured to determine the initial interference electric field intensity from the value range according to the preset stride length, input the initial interference electric field intensity into the first expression and the second expression, and calculate the candidate voltages of the to-be-measured wire;
- a determination subunit, configured to determine whether the candidate voltages of the to-be-measured wire satisfy the preset condition; in which the preset condition includes that the difference value between the candidate voltages of the to-be-measured wire is less than the preset difference value threshold;
- a voltage determination subunit, configured to take the candidate voltage of the to-be-measured wire that satisfies the preset condition as the voltage of the to-be-measured wire.

In another embodiment, the wire voltage measurement apparatus further includes:
- an interference electric field intensity determination module, configured to determine a new interference electric field intensity according to the initial interference electric field intensity and the preset stride length when the candidate voltages of the to-be-measured wire dissatisfy the preset condition;
- a wire voltage determination module, configured to perform an iterative operation with the new interference electric field intensity as the initial interference electric field intensity, and generate the candidate voltages of the to-be-measured wire until one of the candidate voltages of the to-be-measured wire satisfies the preset condition, and take one of the candidate voltages of the to-be-measured wire satisfying the preset condition as the voltage of the to-be-measured wire.

In a wire voltage measurement apparatus based on electric field sensors provided by another embodiment, the voltage calculation module includes:
- a first calculation unit, configured to calculate the first perpendicular distance between the first electric field sensor and the to-be-measured wire, and the first included angle between the first electric field sensor and the to-be-measured wire according to the at least four initial electric field intensities, the external interference electric field intensity in the electric field sensitive direction, the first corresponding relationship, and the spatial position relationship of the at least four electric field sensors;
- a corresponding relationship calculation unit, configured to calculate the third corresponding relationship according to the at least four initial electric field intensities, the external interference electric field intensity in the electric field sensitive direction, the first corresponding relationship, and the spatial position relationship of the at least four electric field sensors; in which the third corresponding relationship is a corresponding relationship of the difference value between the first initial electric field intensity and the second initial electric field intensity, the voltage of the to-be-measured wire, the distance between the first electric field sensor and the second electric field sensor, the first perpendicular distance between the first electric field sensor and the to-be-measured wire, and the first included angle between the first electric field sensor and the to-be-measured wire;
- a voltage calculation unit, configured to calculate the voltage of the to-be-measured wire according to the first perpendicular distance between the first electric field sensor and the to-be-measured wire, the first included angle between the first electric field sensor and the to-be-measured wire, and the third corresponding relationship.

In the wire voltage measurement apparatus provided by another embodiment, the first calculation unit further includes:
- a third expression calculation subunit, configured to calculate the third expression related to the first perpendicular distance and the first included angle according to the first initial electric field intensity, the second initial electric field intensity, the third initial electric field intensity, the external interference electric field intensity in the electric field sensitive direction, the first corresponding relationship, and the spatial position relationship of the first electric field sensor, the second electric field sensor, and the third electric field sensor;
- a fourth expression calculation subunit, configured to calculate the fourth expression related to the first perpendicular distance and the first included angle according to the first initial electric field intensity, the second initial electric field intensity, the fourth initial electric field intensity, the external interference electric field intensity in the electric field sensitive direction, the first corresponding relationship, and the spatial position relationship of the first electric field sensor, the second electric field sensor, and the fourth electric field sensor;

a distance and included angle calculation subunit, configured to calculate the first perpendicular distance between the first electric field sensor and the to-be-measured wire, and the first included angle between the first electric field sensor and the to-be-measured wire according to the third expression and the fourth expression.

Optionally, the above-mentioned distance and included angle calculation subunit is also configured to: calculate the first initial perpendicular distance between the first electric field sensor and the to-be-measured wire, and the first initial included angle between the first electric field sensor and the to-be-measured wire according to the third expression and the fourth expression; and determine whether the first initial perpendicular distance and the first initial included angle satisfy the preset condition, in which the preset condition includes that the first initial perpendicular distance is a positive value, and the first initial included angle is greater than the preset included angle threshold; and take the first initial perpendicular distance and the first initial included angle that satisfy the preset condition as the first perpendicular distance between the first electric field sensor and the to-be-measured wire, and the first included angle between the first electric field sensor and the to-be-measured wire.

In the wire voltage measurement apparatus provided by another embodiment, the corresponding relationship calculation unit includes:

an electric field intensity component calculation subunit, configured to calculate the electric field intensity component of the electric field intensity of the to-be-measured wire mapped in the electric field sensitive direction;

a corresponding relationship establishment subunit, configured to establish the fourth corresponding relationship of the electric field intensity component, the external interference electric field intensity in the electric field sensitive direction, and the at least four initial electric field intensities;

a corresponding relationship calculation subunit, configured to calculate the third corresponding relationship according to the fourth corresponding relationship and the spatial position relationship of the at least four electric field sensors.

Each module in the above-mentioned wire voltage measurement apparatus can be implemented in whole or in part by software, hardware and a combination thereof. The above modules can be embedded in or independent of the processor in the computer device in the form of hardware, or stored in the memory of the computer device in the form of software, so that the processor can call and execute the operations corresponding to the above modules.

Figure 15:
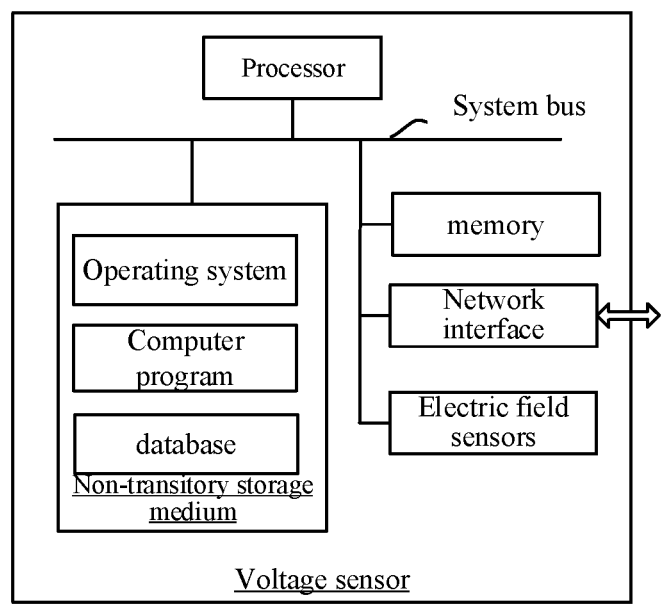
FIG. 15 is a diagram illustrating an internal structure of a voltage sensor according to an embodiment.

In an embodiment, a voltage sensor is provided, and an internal structure diagram of the voltage sensor can be as shown in FIG. 15. The voltage sensor includes a processor, a memory, and a network interface and a plurality of electric field sensors connected by a system bus. The processor of the voltage sensor is configured to provide computing and control capabilities; and the memory includes a non-transitory storage medium and an internal memory. The non-transitory storage medium stores an operating system, a computer program, and a database. The internal memory provides an environment for the execution of the operating system and computer program in the non-transitory storage medium. The database of the computer device is configured to store all the data involved in the wire voltage measurement method and the wire voltage calculation method, etc. The network interface of the computer device is configured to communicate with an external terminal through a network connection. The computer program is executed by the processor to implement a wire voltage measurement method.

Those skilled in the art can understand that the structure shown in FIG. 15 is merely a block diagram of a partial structure related to the solution of the present disclosure, and does not constitute a limitation on the computer device to which the solution of the present disclosure is applied. A specific computer device can include more or fewer components than shown in the figure, or combine certain components, or have a different arrangement of components.

In an embodiment of the present disclosure, a computer-readable storage medium is further provided. One or more non-transitory computer-readable storage media containing computer-executable instructions, when the computer-executable instructions are executed by one or more processors, causes a processor to perform steps of a wire voltage measurement method based on an electric field sensor.

In an embodiment of the present disclosure, a computer program product containing instructions is further provided, which, when executed on a computer, causes the computer to perform steps of a wire voltage measurement method based on an electric field sensor.

It should be noted that the data involved in the present disclosure (including but not limited to data stored in the voltage sensor in advance, data used for the wire voltage calculation, stored data, etc.) are all information and data authorized by a user or fully authorized by all parties.

Those of ordinary skill in the art can understand that all or part of the processes in the methods of the above embodiments can be implemented by instructing relevant hardware through a computer program, and the computer program can be stored in a non-transitory computer-readable storage medium; when the computer program is executed, the processes of the above-mentioned method embodiments can be performed. Any reference to a memory, a database or other media used in the various embodiments provided in the present disclosure may include at least one of a non-transitory memory and a transitory memory. The non-transitory memory may include a Read-Only Memory (ROM), a magnetic tape, a floppy disk, a flash memory, an optical memory, a high-density embedded non-transitory memory, a Resistive Random Access Memory (ReRAM), a Magnetoresistive Random Access Memory (MRAM), a Ferroelectric Random Access Memory (FRAM), a Phase Change Memory (PCM), a graphene memory, etc. The transitory memory may include a Random Access Memory (RAM) or an external cache memory, and the like. By way of illustration and not limitation, the RAM may be in various forms, such as a Static Random Access Memory (SRAM) or a Dynamic Random Access Memory (DRAM). The database involved in the various embodiments provided in the present disclosure may include at least one of a relational database and a non-relational database. The non-relational database may include a blockchain-based distributed database, etc., but is not limited thereto. The processors involved in the various embodiments provided in the present disclosure may be general-purpose processors, central processing units, graphics processors, digital signal processors, programmable logic devices, data processing logic devices based on quantum computing, etc., and are not limited to this.

The technical features of the above embodiments can be combined arbitrarily. In order to make the description simple, all possible combinations of the technical features in the above embodiments are not described. However, as long as there is no contradiction in the combination of these technical features, they should be considered to be the scope of the present disclosure.

The above-mentioned embodiments are merely some embodiments of the present disclosure, and the descriptions thereof are relatively specific and detailed, but should not be construed as a limitation on the scope of the present disclosure. It should be noted that those skilled in the art can make several modifications and improvements without departing from the concept of the present disclosure, which all fall within the protection scope of the present disclosure. Therefore, the scope of protection of the present disclosure should be subject to the appended claims.

What is claimed is:

1. A wire voltage measurement method based on electric field sensors, applied to a voltage sensor comprising at least four electric field sensors, and the at least four electric field sensors being arranged along the same straight line, the method comprising:

acquiring a first corresponding relationship of an electric field intensity of a to-be-measured wire, a voltage of the to-be-measured wire, and a perpendicular distance between an electric field sensor and the to-be-measured wire;

measuring at least four initial electric field intensities in an electric field sensitive direction through the at least four electric field sensors, and acquiring distances among the at least four electric field sensors along the straight line;

calculating a second corresponding relationship of the voltage of the to-be-measured wire and an external interference electric field intensity in the electric field sensitive direction according to the at least four initial electric field intensities, the distances among the at least four electric field sensors along the straight line, the first corresponding relationship, and a spatial position relationship of the at least four electric field sensors;

calculating the voltage of the to-be-measured wire according to the second corresponding relationship.

2. The method according to claim 1, wherein the at least four electric field sensors comprises a first electric field sensor, a second electric field sensor, a third electric field sensor, and a fourth electric field sensor; the first electric field sensor is configured to measure a first initial electric field intensity, the second electric field sensor is configured to measure a second initial electric field intensity, the third electric field sensor is configured to measure a third initial electric field intensity, and the fourth electric field sensor is configured to measure a fourth initial electric field intensity.

3. The method according to claim 1, wherein the calculating the second corresponding relationship of the voltage of the to-be-measured wire and the external interference electric field intensity in the electric field sensitive direction according to the at least four initial electric field intensities, the distances among the at least four electric field sensors along the straight line, the first corresponding relationship, and the spatial position relationship of the at least four electric field sensors comprises:

calculating a first expression related to the voltage of the to-be-measured wire and the interference electric field intensity in the electric field sensitive direction according to the first initial electric field intensity, the second initial electric field intensity, the third initial electric field intensity, the external interference electric field intensity in the electric field sensitive direction, the first corresponding relationship and a spatial position relationship of the first electric field sensor, the second electric field sensor, and the third electric field sensor;

calculating a second expression related to the voltage of the to-be-measured wire and the interference electric field intensity in the electric field sensitive direction according to the first initial electric field intensity, the second initial electric field intensity, the fourth initial electric field intensity, the external interference electric field intensity in the electric field sensitive direction, the first corresponding relationship, and a spatial position relationship of the first electric field sensor, the second electric field sensor, and the fourth electric field sensor.

4. The method according to claim 3, wherein the calculating the voltage of the to-be-measured wire according to the second corresponding relationship comprises:

determining a value range of the interference electric field intensity in the electric field sensitive direction according to the at least four initial electric field intensities;

determining an initial interference electric field intensity from the value range according to a preset stride length, inputting the initial interference electric field intensity into the first expression and the second expression, and calculating candidate voltages of the to-be-measured wire;

determining whether the candidate voltages of the to-be-measured wire satisfy a preset condition, wherein the preset condition comprises that a difference value between the candidate voltages of the to-be-measured wire is less than a preset difference value threshold;

taking a candidate voltage of the to-be-measured wire satisfying the preset condition as the voltage of the to-be-measured wire.

5. The method according to claim 4, further comprising:

determining a new interference electric field intensity according to the initial interference electric field intensity and the preset stride length when the candidate voltages of the to-be-measured wire dissatisfy the preset condition;

performing an iterative operation with the new interference electric field intensity as the initial interference electric field intensity, and generating the candidate voltages of the to-be-measured wire until the candidate voltages of the to-be-measured wire satisfy the preset condition, and take one of the candidate voltages of the to-be-measured wire satisfying the preset condition as the voltage of the to-be-measured wire.

6. The method according to claim 2, wherein the at least four electric field sensors are arranged on a plane perpendicular to the to-be-measured wire, and calculating the voltage of the to-be-measured wire according to the at least four initial electric field intensities, the distances among the at least four electric field sensors along the straight line, and the first corresponding relationship comprises:

calculating a first perpendicular distance between the first electric field sensor and the to-be-measured wire and a first included angle between the first electric field sensor and the to-be-measured wire according to the at least four initial electric field intensities, the external interference electric field intensity in the electric field sensitive direction, the first corresponding relationship, and the spatial position relationship of the at least four electric field sensors;

calculating a third corresponding relationship according to the at least four initial electric field intensities, the external interference electric field intensity in the electric field sensitive direction, the first corresponding relationship, and the spatial position relationship of the at least four electric field sensors, wherein the third corresponding relationship is a corresponding relationship of a difference value between the first initial electric field intensity and the second initial electric field intensity, the voltage of the to-be-measured wire, a distance between the first electric field sensor and the second electric field sensor, the first perpendicular distance between the first electric field sensor and the to-be-measured wire, and the first included angle between the first electric field sensor and the to-be-measured wire;

calculating the voltage of the to-be-measured wire according to the first perpendicular distance between the first electric field sensor and the to-be-measured wire, the first included angle between the first electric field sensor and the to-be-measured wire, and the third corresponding relationship.

7. The method according to claim 6, wherein the calculating the first perpendicular distance between the first electric field sensor and the to-be-measured wire and the first included angle between the first electric field sensor and the to-be-measured wire according to the at least four initial electric field intensities, the external interference electric field intensity in the electric field sensitive direction, the first corresponding relationship, and the spatial position relationship of the at least four electric field sensors comprises:

calculating a third expression related to the first perpendicular distance and the first included angle according to the first initial electric field intensity, the second initial electric field intensity, the third initial electric field intensity, the external interference electric field intensity in the electric field sensitive direction, the first corresponding relationship, and the spatial position relationship of the first electric field sensor, the second electric field sensor, and the third electric field sensor;

calculating a fourth expression related to the first perpendicular distance and the first included angle according to the first initial electric field intensity, the second initial electric field intensity, the fourth initial electric field intensity, the external interference electric field intensity in the electric field sensitive direction, the first corresponding relationship, and the spatial position relationship of the first electric field sensor, the second electric field sensor, and the fourth electric field sensor;

calculating the first perpendicular distance between the first electric field sensor and the to-be-measured wire and the first included angle between the first electric field sensor and the to-be-measured wire according to the third expression and the fourth expression.

8. The method according to claim 7, wherein the calculating the first perpendicular distance between the first electric field sensor and the to-be-measured wire and the first included angle between the first electric field sensor and the to-be-measured wire according to the third expression and the fourth expression comprises:

calculating a first initial perpendicular distance between the first electric field sensor and the to-be-measured wire, and a first initial included angle between the first electric field sensor and the to-be-measured wire according to the third expression and the fourth expression;

determining whether the first initial perpendicular distance and the first initial included angle satisfy the preset condition, wherein the preset condition comprises that the first initial perpendicular distance is a positive value, and the first initial included angle is greater than a preset included angle threshold;

taking the first initial perpendicular distance and the first initial included angle that satisfy the preset condition respectively as the first perpendicular distance between the first electric field sensor and the to-be-measured wire, and the first included angle between the first electric field sensor and the to-be-measured wire.

9. The method according to claim 6, wherein the calculating the third corresponding relationship according to the at least four initial electric field intensities, the external interference electric field intensity in the electric field sensitive direction, the first corresponding relationship, and the spatial position relationship of the at least four electric field sensors comprises:

calculating an electric field intensity component of an electric field intensity of the to-be-measured wire mapped in the electric field sensitive direction;

establishing a fourth corresponding relationship of the electric field intensity component, the external interference electric field intensity in the electric field sensitive direction, and the at least four initial electric field intensities;

calculating the third corresponding relationship according to the fourth corresponding relationship and the spatial position relationship of the at least four electric field sensors.

10. A wire voltage measurement apparatus based on electric field sensors, applied to a voltage sensor comprising at least four electric field sensors, and the at least four electric field sensors being arranged along the same straight line, the apparatus comprising:

a first acquisition module, configured to acquire a first corresponding relationship of an electric field intensity of a to-be-measured wire, a voltage of the to-be-measured wire, and a perpendicular distance between the electric field sensors and the to-be-measured wire;

a second acquisition module, configured to measure at least four initial electric field intensities in an electric field sensitive direction through the at least four electric field sensors, and acquire distances among the at least four electric field sensors along the straight line;

a voltage calculation module, configured to: calculate a second corresponding relationship of the voltage of the to-be-measured wire and an external interference electric field intensity in the electric field sensitive direction according to the at least four initial electric field intensities, the distances among the at least four electric field sensors along the straight line, the first corresponding relationship, and a spatial position relationship of the at least four electric field sensors; and calculate the voltage of the to-be-measured wire according to the second corresponding relationship.

11. A voltage sensor, comprising a processor and a memory storing a computer program, wherein the processor, when executing the computer program, performs the method of claim 1.

12. A computer-readable storage medium, on which a computer program is stored, wherein a processor, when executing the computer program, performs the method of claim 1.

13. A computer program product, comprising a computer program, wherein a processor, when executing the computer program, performs the method of claim 1.

\* \* \* \* \*